(12) United States Patent
Zhou et al.

(10) Patent No.: US 9,356,568 B2
(45) Date of Patent: May 31, 2016

(54) APPARATUS AND METHODS FOR CHOPPER AMPLIFIERS

(71) Applicant: Analog Devices, Inc., Norwood, MA (US)

(72) Inventors: Jie Zhou, Saratoga, CA (US); Arthur J. Kalb, Santa Clara, CA (US); Mark D. Reisiger, San Jose, CA (US)

(73) Assignee: ANALOG DEVICES, INC., Norwood, MA (US)

( * ) Notice: Subject to any disclaimer, the term of this patent is extended or adjusted under 35 U.S.C. 154(b) by 125 days.

(21) Appl. No.: 14/334,569

(22) Filed: Jul. 17, 2014

(65) Prior Publication Data

US 2015/0054576 A1   Feb. 26, 2015

Related U.S. Application Data

(60) Provisional application No. 61/869,558, filed on Aug. 23, 2013.

(51) Int. Cl.
*H03F 3/393* (2006.01)
*H03F 3/45* (2006.01)

(52) U.S. Cl.
CPC ............ *H03F 3/393* (2013.01); *H03F 3/45192* (2013.01); *H03F 3/45775* (2013.01); *H03F 2200/271* (2013.01); *H03F 2203/45048* (2013.01)

(58) Field of Classification Search
CPC .............................. H03F 3/45892; H03F 1/02
USPC ....................................... 330/9; 327/124, 307
See application file for complete search history.

(56) References Cited

U.S. PATENT DOCUMENTS

| 4,468,607 A | 8/1984 | Tanaka et al. |
| 4,800,303 A | 1/1989 | Graham et al. |

(Continued)

FOREIGN PATENT DOCUMENTS

WO    WO 2006/053098    5/2006

OTHER PUBLICATIONS

Conroy et al., Statistical Design Techniques for D/A Converters, IEEE Journal of Solid-State Circuits, vol. 24, No. 4, Aug. 1989, 11 pages.

(Continued)

*Primary Examiner* — Henry Choe
(74) *Attorney, Agent, or Firm* — Knobbe Martens Olson & Bear LLP

(57) ABSTRACT

Apparatus and methods for chopper amplifiers are provided herein. In certain configurations, a chopper amplifier includes at least one differential transistor bank including a selection circuit and a plurality of transistors. The selection circuit can select a first portion of the transistors for operation in a first transistor group and a second portion of the transistors for operation in a second transistor group. During calibration, the chopper amplifier's input offset can be observed for different transistor configurations of the differential transistor banks. Although the transistors of a particular bank can be designed to have about the same drive-strength and/or geometry, the chopper amplifier can have a different input offset in different transistor configurations due to manufacturing mismatch between transistors, such as process variation. The chopper amplifier can be programmed to operate with the selected transistor configurations of the differential transistor banks to provide the amplifier with low input offset.

23 Claims, 19 Drawing Sheets

(56) References Cited

U.S. PATENT DOCUMENTS

| | | | |
|---|---|---|---|
| 5,006,854 | A | 4/1991 | White et al. |
| 5,305,004 | A | 4/1994 | Fattaruso |
| 5,404,142 | A | 4/1995 | Adams et al. |
| 5,684,482 | A | 11/1997 | Galton |
| 6,194,962 | B1 | 2/2001 | Chen |
| 6,424,211 | B1 | 7/2002 | Nolan et al. |
| 6,476,671 | B1 | 11/2002 | Tang |
| 6,518,899 | B2 | 2/2003 | Yu |
| 6,549,062 | B1 | 4/2003 | Washburn et al. |
| 6,696,894 | B1 | 2/2004 | Huang |
| 6,697,286 | B2 | 2/2004 | Nakagawa |
| 6,744,280 | B2 | 6/2004 | Morgan et al. |
| 6,756,817 | B2 | 6/2004 | Tamura et al. |
| 6,812,735 | B1 | 11/2004 | Pham |
| 6,960,931 | B2 | 11/2005 | Turcotte |
| 7,046,182 | B1 | 5/2006 | Ja et al. |
| 7,049,889 | B2 | 5/2006 | Kalb |
| 7,173,552 | B1 | 2/2007 | Garcia |
| 7,342,411 | B2 | 3/2008 | Vergis et al. |
| 7,358,809 | B2 | 4/2008 | Elder |
| 7,521,957 | B2 | 4/2009 | Koo |
| 7,573,323 | B2 | 8/2009 | Moholt et al. |
| 7,733,120 | B2 | 6/2010 | Kato et al. |
| 7,945,868 | B2 | 5/2011 | Pileggi et al. |
| 8,598,904 | B2 | 12/2013 | Kalb et al. |
| 2004/0008054 | A1 | 1/2004 | Lesea et al. |
| 2005/0052141 | A1 | 3/2005 | Thielemans et al. |
| 2005/0127978 | A1 | 6/2005 | Cranford et al. |
| 2005/0189961 | A1 | 9/2005 | Frans et al. |
| 2006/0125563 | A1 | 6/2006 | Elder |
| 2007/0170981 | A1 | 7/2007 | Burt et al. |
| 2007/0194844 | A1* | 8/2007 | Signori et al. .................. 330/9 |
| 2009/0160479 | A1 | 6/2009 | Lange et al. |
| 2014/0312967 | A1* | 10/2014 | Nagahisa ........................ 330/9 |
| 2014/0340145 | A1* | 11/2014 | Funato et al. .................. 330/9 |
| 2015/0357979 | A1* | 12/2015 | Ouchi ............................. 330/9 |

OTHER PUBLICATIONS

Garcia, Santiago Iriarte, 16-Bit D/A Converter having Switchable Current Sources and a Current Divider, University of Limerick, Limerick, Ireland, Oct. 1, 2003, 179 pages.

Carley, L.R., A noise-shaping coder topology for 15+ bit converters, IEEE Journal of Solid-State Circuits, vol. 24, No. 2, Apr. 1989, 7 pages.

Leung, B.H., Architectures for Multi-bit Oversampled A/D Converter Employing Dynamic Element Matching Techniques, Circuits and Systems, 1991, IEEE International Symposium, pp. 1657-1660, vol. 3, Jun. 11-14, 1991, 13 pages.

Flynn et al., Digital calibration incorporating redundancy of flash ADCs, Circuits and Systems II: IEEE Transactions on Analog and Digital Signal Processing, vol. 50, No. 5, pp. 205-213, May 2003.

Enz et al, Circuit Techniques for Reducing the Effects of Op-amp Imperfections: Auto zeroing, Correlated Double Sampling, and Chopper Stabilization, Proc. Of IEEE, V. 84, No. 11, 1996, 31 pages.

Akita et al., A 0.06mm$^2$ 14nV/Hz Chopper Instrumentation Amplifier with Automatic Differential-Pair Matching, ISSCC 2013, Feb. 2013, 3 pages.

Witte et al, A CMOS Chopper Offset-Stabilized Opamp, IEEE JSSC, v.42, No. 7, 2007, 7 pages.

Wu, R., J.H. Huijsing, and K.A.A. Makinwa, A Current-Feedback Instrumentation Amplifier With a Gain Error Reduction Loop and 0.06% Untrimmed Gain Error, IEEE J. Solid-State Circuits, vol. 46, No. 12, pp. 2794-2806, Dec. 2011.

Kusuda, Y., Auto Correction Feedback for Ripple Suppression in a Chopper Amplifier, IEEE J. Solid-State Circuits, vol. 45, No. 8, pp. 1436-1445, Aug. 2010.

\* cited by examiner

APPARATUS AND METHODS FOR CHOPPER AMPLIFIERS

CROSS-REFERENCE TO RELATED APPLICATIONS

The present application claims priority to U.S. Provisional Patent Application No. 61/869,558, filed Aug. 23, 2013, titled "APPARATUS AND METHODS FOR CHOPPER AMPLIFIERS," the entirety of which is hereby incorporated herein by reference. This application is related to U.S. application Ser. No. 11/810,517, filed on Jun. 5, 2007, entitled "APPARATUS AND METHODS FOR FORMING ELECTRICAL NETWORKS THAT APPROXIMATE DESIRED PERFORMANCE CHARACTERISTICS", now U.S. Pat. No. 8,598,904, issued Dec. 3, 2013, the disclosure of which is hereby incorporated by reference in its entirety herein.

BACKGROUND

1. Field

Embodiments of the invention relate to electronic devices, and more particularly, to chopper amplifiers.

2. Description of the Related Technology

An amplifier, such as an operational amplifier or instrumentation amplifier, can include chopper circuitry for reducing the amplifier's input offset voltage. For example, in a conventional chopper amplifier, input chopping switches can be used to chop or modulate the amplifier's input signal during an input chopping operation, thereby up-shifting the frequency of the amplifier's input signal. Additionally, the amplifier can include a filter for filtering the amplifier's input offset, which can be separated in frequency from the chopped input signal. The amplifier can further include output chopping switches for demodulating or down-shifting the frequency of the chopped input signal during an output chopping operation.

Although including chopper circuitry in an amplifier can reduce the amplifier's input offset voltage, chopping can also generate ripples in the amplifier's output signal at the chopping frequency and at harmonics thereof.

There is a need for amplifiers having improved performance. Additionally, there is need for chopper amplifiers having reduced input offset voltage and reduced output voltage ripple.

SUMMARY

In one embodiment, an apparatus includes a programmable memory configured to generate a first control signal, and a chopper amplifier configured to amplify a differential input voltage signal to generate an output signal. The chopper amplifier includes a first differential transistor bank including a selection circuit and a plurality of transistors. The selection circuit is configured to select a first portion of the plurality of transistors for operation in a first transistor group based on the first control signal, and to select a second portion of the plurality of transistors for operation in a second transistor group based on the first control signal. An input offset voltage of the chopper amplifier varies based on a selection of transistors in the first and second transistor groups.

In another embodiment, a method of calibrating a chopper amplifier is provided. The method includes observing an input offset voltage of the chopper amplifier for each of a plurality of selected transistor configurations of a first differential transistor bank of the chopper amplifier. The first differential transistor bank includes a plurality of transistors, and the selected transistor configurations include different combinations of the plurality of transistors in a first transistor group and in a second transistor group. The method further includes choosing a transistor configuration based on the observations of the input offset voltage, and in a programmable memory, storing data corresponding to the chosen transistor configuration.

DETAILED DESCRIPTION OF EMBODIMENTS

Figure 1A:
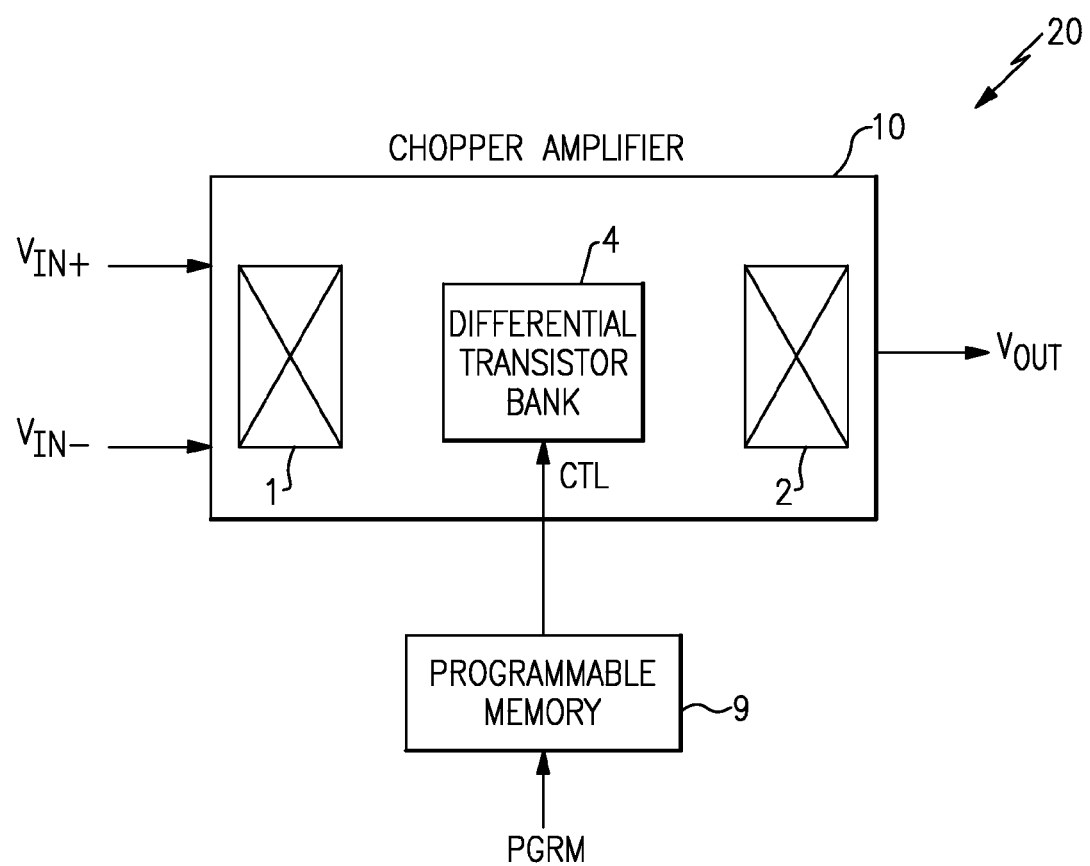
FIG. 1A is a schematic block diagram illustrating one embodiment of an integrated circuit (IC).

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

For certain applications, such as high-precision amplification, it can be desirable for an amplifier to have low input offset. To aid in achieving low input offset, certain amplifiers can use auto-zeroing and/or chopping schemes.

Although using auto-zeroing and/or chopping in an amplifier can reduce input offset, such techniques can have drawbacks. For example, auto-zeroing can generate relatively high low-frequency noise power spectral density (PSD) due to aliasing of wide-band noise into the auto-zero frequency band.

Additionally, chopping can reduce the amplifier's input offset, but can also introduce ripples in the amplifier's output signal due to modulation of the input offset. For example, the chopper amplifier's input chopping switches can operate to modulate or up-shift the frequency spectrum of the input signal by the chopping frequency, and the chopper amplifier's output chopping switches can operate to demodulate or down-shift the frequency spectrum of the amplified input signal by the chopping frequency. However, the amplifier's input amplification stage can be positioned in the chopper amplifier's signal path after the input chopping switches, and thus the input offset would not be modulated by the input chopping switches. Rather, the input offset would be modulated or up-shifted in frequency by the output chopping switches, which can result in ripples in the output signal at the chopping frequency and at harmonics thereof.

Although a low-pass filter can be provided in the chopper amplifier's signal path to attenuate frequency components associated with input offset, the low-pass filter may not completely filter out the input offset and/or may reduce the chopper amplifier's bandwidth below the chopping frequency. Furthermore, even when the chopping frequency is selected to be relatively high to provide relatively wide bandwidth, the high chopping frequency can increase charge-injection related artifacts, and can lead to a decrease in amplifier settling time with attendant increase in power consumption. In other configurations, bandwidth can be extended by configuring the chopper amplifier to include multiple amplification paths. However, such configurations can include additional transfer function poles and/or can include a high-bandwidth path that has high power consumption, occupies a large amount of die area, and increases design complexity. Furthermore, such configurations can suffer from path-mismatch artifacts.

Apparatus and methods for chopper amplifiers are provided herein. In certain configurations, a chopper amplifier includes at least one differential transistor bank, such as a bank associated with differential input pair transistors, differential load transistors, or differential cascode transistors of the amplifier. Each differential transistor bank can include a selection circuit and a plurality of transistors, and the selection circuit can select a first portion of the transistors for operation in a first transistor group and a second portion of the transistors for operation in a second transistor group. During calibration, the chopper amplifier's input offset can be observed or measured for different transistor configurations of the differential transistor banks. Although the transistors of a particular bank can be designed to have about the same drive-strength and/or geometry, the chopper amplifier can have a different input offset in different transistor configurations. For example, prior to chopping, the chopping amplifier can have different amounts of input offset voltage in different transistor configurations. The input offset of the chopper amplifier can change with different transistor configurations due to manufacturing mismatch between transistors, such as manufacturing mismatch associated with process variation.

Although a chopping amplifier may exhibit a relatively small amount of input offset when the amplifier is chopping, the amplifier's input offset voltage prior to chopping may be translated by the chopping operations into output voltage ripple. Accordingly, it can be desirable for the chopping amplifier to have low input offset voltage prior to chopping. Thus, the chopper amplifiers herein can be programmed to operate with the selected transistor configurations of the differential transistor banks to provide the amplifier with low input offset.

The chopper amplifiers herein can achieve low input offset with a relatively small impact on the amplifier's size, power consumption, and/or amplification characteristics relative to certain other input offset reduction schemes. Furthermore, certain chopper amplifiers herein can have small output ripple, small input offset current, low input offset drift and/or low flicker noise.

Overview of Chopper Amplifiers with Reduced Input Offset

FIG. 1A is a schematic block diagram illustrating one embodiment of an integrated circuit (IC) 20. The IC 20 includes a programmable memory 9 and a chopper amplifier 10.

The programmable memory 9 can receive a programming signal PGRM, which can be used to program a state of the programmable memory 9. Although FIG. 1A illustrates the programmable memory 9 as receiving one programming signal, the programmable memory 9 can receive additional programming signals and/or the programming signal PGRM can comprise multiple bits. The programmable memory 9 can generate a control signal CTL based on the programmable memory's state. Although FIG. 1A illustrates the programmable memory 9 as generating one control signal, the programmable memory 9 can generate additional control signals. In certain implementations, the programmable memory 9 can generate multiple control signals and/or the control signal CTL can comprise multiple bits.

The illustrated chopper amplifier 10 includes an input chopping circuit 1, an output chopping circuit 2, and a differential transistor bank 4. The chopper amplifier 10 can receive the control signal CTL and an input signal corresponding to a difference between a positive or non-inverted input voltage $V_{IN+}$ and a negative or inverted input voltage $V_{IN-}$. Additionally, the chopper amplifier 10 can amplify the input signal to generate an output voltage $V_{OUT}$.

Although FIG. 1A illustrates a configuration in which the chopper amplifier 10 generates a single-ended output voltage signal, the chopper amplifier 10 can be adapted to generate other output signals, including, for example, a differential output voltage signal, a single-ended output current signal, a differential output current signal, or a combination thereof. Additionally, although FIG. 1A illustrates the chopper amplifier 10 in an open-loop configuration, the chopper amplifier 10 can be used closed-loop.

The input and output chopping circuits 1, 2 can be used to perform input and output chopping operations, respectively, on the input signal to reduce error in the output voltage $V_{OUT}$ associated with the chopper amplifier's input offset voltage. The input chopping circuit 1 can be used to chop or modulate the input signal before it is amplified by an input amplification stage of the chopper amplifier 10. The output chopping circuit 2 can be used to chop or demodulate the amplified differential input signal, which can be further amplified and/or otherwise processed to generate the output voltage $V_{OUT}$.

The differential transistor bank 4 can include at least a first terminal, a second terminal, a selection circuit, and a plurality of transistors. The plurality of transistors can be individually selected for operation in a first transistor group or subcircuit associated with the first terminal or for operation in a second transistor group or subcircuit associated with the second terminal. The differential transistor bank 4 can be positioned along the amplification path of the chopper amplifier 10. For example, in certain implementations the differential transistor bank 4 can operate as differential input transistors, differential load transistors, or differential cascode transistors of the chopper amplifier 10. In certain implementations, the transistors have about the same geometry on lithographical masks used to fabricate the IC 20.

As shown in FIG. 1A, the differential transistor bank 4 can receive a control signal CTL from a programmable memory 9. The control signal CTL can be used to configure the differential transistor bank 4 with particular configuration of transistors coupled to the bank's terminals. For example, the bank's selection circuit can use the control signal CTL to select a first portion of the transistors for operation in the first transistor group and a second portion of the transistors for operation in the second transistor group.

During device fabrication, each transistor from the differential transistor bank 4 can incur a random offset voltage, which may vary with operating point, such as temperature, supply voltage, bias current, and/or common-mode input voltage. For a given transistor configuration, the total offset of the differential transistor bank of selectively connected transistors can be about equal to the sum of all of the offsets of transistors in the bank's first transistor group minus a sum of all of the offsets of transistors in the bank's second transistor group.

In certain configurations, the input offset of the chopper amplifier 10 can be observed during calibration for a variety of transistor configurations of the differential transistor bank 4. Additionally, the data can be used to select a particular transistor configuration of the differential transistor bank 4 having low input offset. Additionally, the programmable memory 9 can be programmed with data corresponding to the selected transistor configuration, such that the chopper amplifier 10 operates with the selected transistor configuration of the differential transistor bank 4 during operation. Examples of calibration processes for a chopper amplifier such as the chopper amplifier 10 will be described further below with reference to FIGS. 13 and 14.

Thus, the differential transistor bank 4 of the chopper amplifier 10 can be programmed to include a transistor configuration having reduced or minimum input offset relative to other possible transistor configurations of the differential transistor bank 4. The low input offset can also lead to small output ripple and/or low input offset current associated with charging and discharging input capacitance during chopping.

In certain configurations, the programmable memory 9 can be a non-volatile memory, including, for example, a flash memory, a read-only memory (ROM), a memory implemented using fuses and/or anti-fuses, and/or a magnetic storage device. However, other configurations are possible, such as implementations in which the programmable memory 9 is a volatile memory that is programmed to include data corresponding to the selected transistor configuration during power-up or turn-on and/or programmed with the data during a calibration sequence.

Although FIG. 1A illustrates the chopper amplifier 10 as including one differential transistor bank, the teachings herein are applicable to configurations in which a chopper amplifier includes additional differential transistor banks. In such configurations, the programmable memory 9 can be configured to provide additional control signals for the additional differential transistor banks.

Figure 1B:
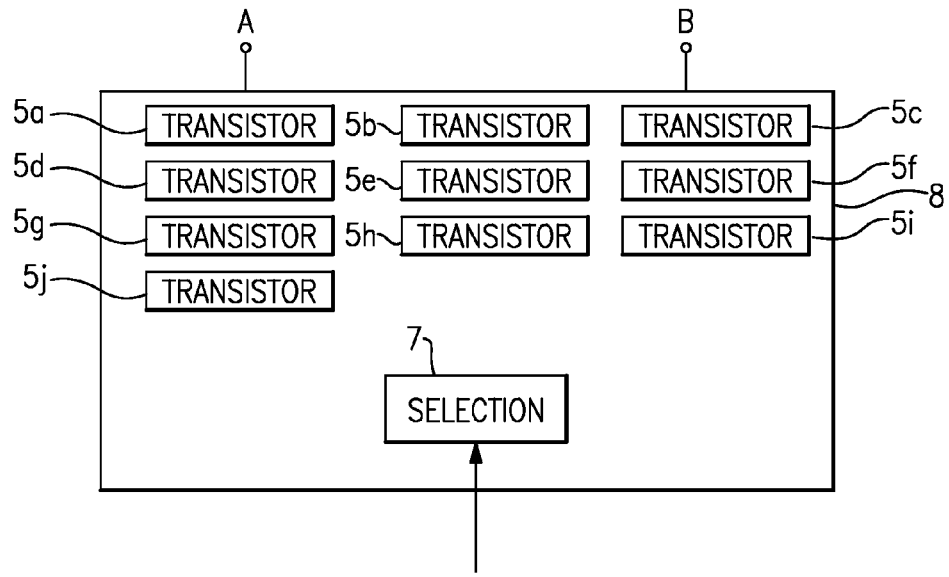
FIGS. 1B and 1C are schematic block diagrams of a differential transistor bank according to one embodiment.
Figure 1C:
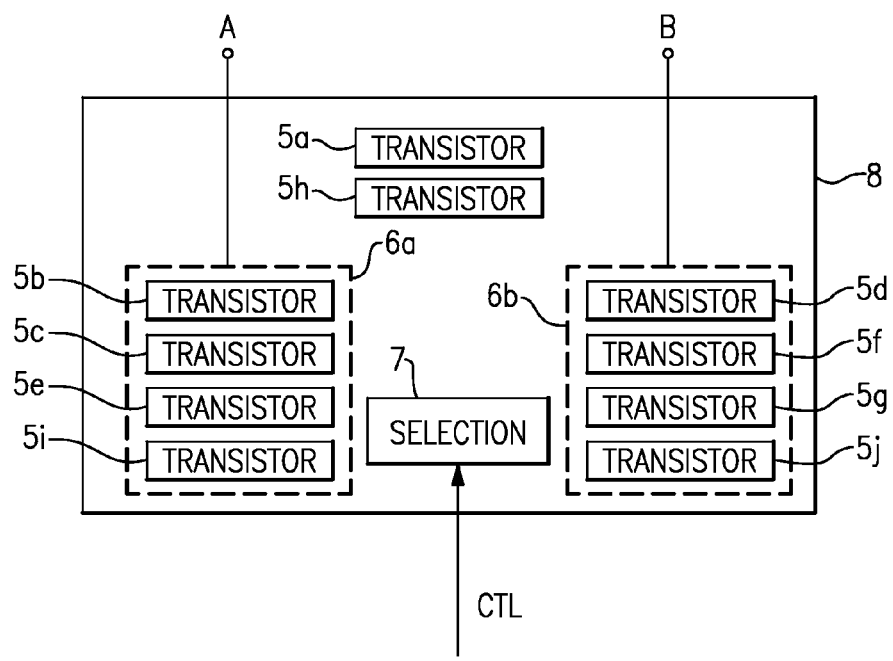

FIGS. 1B and 1C are schematic block diagrams of a differential transistor bank 8 according to one embodiment. The differential transistor bank 8 illustrates one implementation of the differential transistor bank 4 of FIG. 1A. FIG. 1B illustrates the differential transistor bank 8 prior to configuration by a control signal CTL, and FIG. 1C illustrates one example of the differential transistor bank 8 after configuration by the control signal CTL.

The differential transistor bank 8 includes a first terminal A, a second terminal B, first to tenth transistors 5a-5j, and a selection circuit 7, which is configured to receive the control signal CTL.

The selection circuit 7 can use the control signal CTL to select a first portion of the transistors 5a-5j for operation in a first transistor group 6a and to select a second portion of the transistors 5a-5j for operation in a second subcircuit 6b.

In certain implementations, the transistors 5a-5j are designed to have substantially the same drive-strength and/or geometry absent manufacturing variation, and the selection circuit 7 is configured to include an equal number of transistors in the first and second subcircuits 6a, 6b.

During fabrication of an IC including the differential transistor bank 8, each of the transistors 5a-5j can incur a random offset voltage. For a given configuration of the transistors in the first and second subcircuits 6a, 6b, the total offset of the differential transistor bank 8 can be about equal to the sum of the offsets of transistors in the first subcircuit 6a minus a sum of the offsets of transistors in the second subcircuit 6b.

During calibration of a chopper amplifier that includes the differential transistor bank 8, different selected combinations of transistors can be included in the first and second subcircuits 6a, 6b, and an input offset of the amplifier can be observed for each selected transistor configuration. In certain configurations, an input offset of the amplifier is observed when the amplifier in the not chopping. In other configurations, a residual input offset of the amplifier is observed while the amplifier is chopping.

Additionally, using the data, a particular transistor configuration can be selected, such as a combination of transistors having the smallest amplifier input offset. Additionally, a programmable memory, such as the programmable memory 9 of FIG. 1A, can be programed with data corresponding to the selected transistor configuration. The programmable memory can generate the control signal CTL, which the selection circuit 7 can use to select the transistors that operate in the first and second subcircuits 6a, 6b.

In the illustrated example, the selection circuit 7 has used the control signal CTL to select the second, third, fifth, and ninth transistors 5b, 5c, 5e, 5i for operation in the first transistor group 6a. Additionally, the selection circuit 7 has used the control signal CTL to select the fourth, sixth, seventh, and tenth transistors 5d, 5f, 5g, 5j for operation in the second transistor group 6b. Furthermore, in the illustrated example, the first and eighth transistors 5a, 5h have not been selected for operation in either the first or second transistor groups 6a, 6b.

FIG. 1C illustrates one example of a possible distribution of the transistors 5a-5j between the first and second transistor groups 6a, 6b. However, the distribution shown in FIG. 1C is illustrative, and the differential transistor bank 8 can be programmed in other ways.

Although the illustrated differential transistor bank 8 includes ten transistors, a differential transistor bank can be adapted to include more or fewer transistors. In one embodiment, a differential transistor bank includes between about 4 and about 24 transistors. However, other configurations are possible.

As described above, the selection circuit 7 can use the control signal CTL to select a first portion of the transistors 5a-5j to include in the first transistor group 6a and to select a second portion of the transistors 5a-5j to include in the second transistor group 6b. In the illustrated configuration, less than all of the transistors 5a-5j are selected for operation in the first and second transistor groups 6a, 6b. However, other configurations are possible, such as implementations in which each of the transistors 5a-5j is included in either the first transistor group 6a or in the second transistor group 6b.

In certain implementations, the selection circuit 7 can include circuitry for selectively including any particular transistor in either the first transistor group 6a or in the second transistor group 6b. However, in other configurations, certain transistors can be selectively included in only one particular transistor group. For example, in one embodiment, the selection circuit 7 selects the first transistor group 6a from a first set or pool of transistors and selects the second transistor group 6b from a second set of transistors, where at least a portion of the transistors in the first and second sets of transistors are different.

The transistors 5a-5h can correspond to transistors of a wide variety of types. In one embodiment, the transistors 5a-5h include field-effect transistors (FETs), such as metal oxide semiconductor (MOS) transistors or junction field-effect transistors (JFETs). However, other configurations are possible, such as implementations in which the transistors 5a-5h include bipolar transistors.

In certain configurations, the transistors included in a particular transistor group are electrically connected in parallel. For example, in a configuration using FETs, the transistors selected for operation in the first subcircuit 6a can have drains connected to one another, sources connected to one another, and/or gates connected to one another. Similarly, the transistors selected for operation in the second subcircuit 6b can have drains connected to one another, sources connected to one another, and/or gates connected to one another.

Although FIGS. 1B and 1C illustrates the differential transistor bank 8 as including two terminals, the differential transistor bank 8 can be adapted to include additional terminals. For example, in a configuration using FETs, the differential transistor bank 8 can include terminals associated with the drains, sources, and/or gates of the transistors in the first and second subcircuits 6a, 6b. Various examples of differential transistor banks will be described in detail further below.

FIGS. 2-7 are circuit diagrams of chopper amplifiers according to various embodiments.

Figure 2:
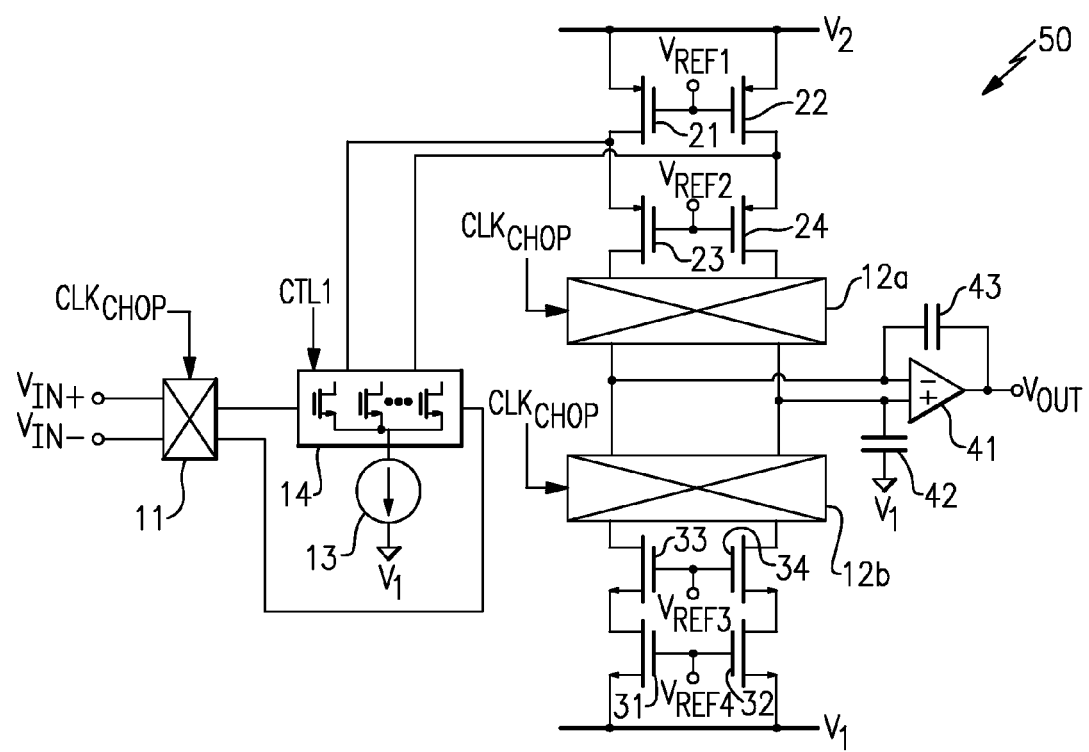
FIGS. 2-7 are circuit diagrams of chopper amplifiers according to various embodiments.

FIG. 2 is a circuit diagram of a chopper amplifier 50 according to one embodiment. The chopper amplifier 50 includes a first or non-inverting input terminal $V_{IN+}$, a second or inverting input terminal $V_{IN-}$, an output terminal $V_{OUT}$, an input chopping circuit 11, a first output chopping circuit 12a, a second output chopping circuit 12b, a current source 13, a first differential transistor bank 14, first and second p-type metal oxide semiconductor (PMOS) load transistors 21, 22, first and second PMOS cascode transistors 23, 24, first and second n-type metal oxide semiconductor (NMOS) load transistors 31, 32, first and second NMOS cascode transistors 33, 34, an output amplification circuit 41, an integration capacitor 42, and a feedback capacitor 43.

As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics.

The input chopping circuit 11 includes a first input electrically connected to the non-inverted input terminal $V_{IN+}$, a second input electrically connected to the inverted input terminal $V_{IN-}$, a clock input configured to receive a chopping clock signal $CLK_{CHOP}$, a first output electrically connected to a first gate terminal of the first differential transistor bank 14, and a second output terminal electrically connected to a second gate terminal of the first differential transistor bank 14. The current source 13 is electrically connected between a common source terminal of the first differential transistor bank 14 and a first supply voltage $V_1$, which can be, for example, a power low or ground supply. The current source 13 can be used to provide a bias current to the common source terminal of the first differential transistor bank 14. The first differential transistor bank 14 further includes a control terminal configured to receive a first control signal CTL1 from a programmable memory, such as the programmable memory 9 of FIG. 1A. The first differential transistor bank 14 further includes a first drain terminal electrically connected to a drain of the first PMOS load transistor 21 and to a source of the first PMOS cascode transistor 23. The first differential transistor bank 14 further includes a second drain terminal electrically connected to a drain of the second PMOS load transistor 22 and to a source of the second PMOS cascode transistor 24.

The first PMOS load transistor 21 further includes a gate electrically connected to a first reference voltage $V_{REF1}$ and to a gate of the second PMOS load transistor 22. The first PMOS load transistor 21 further includes a source electrically connected to a second supply voltage $V_2$, which can be, for example, a power high supply. The second PMOS load transistor 22 further includes a source electrically connected to the second supply voltage $V_2$. The first PMOS cascode transistor 23 further includes a gate electrically connected to a second reference voltage $V_{REF2}$ and to a gate of the second PMOS cascode transistor 24. The first PMOS cascode transistor 23 further includes a drain electrically connected to a first input of the first output chopping circuit 12a. The second PMOS cascode transistor 24 further includes a drain electrically connected to a second input of the first output chopping circuit 12a. The first output chopping circuit 12a further includes a clock input configured to receive the chopping clock signal $CLK_{CHOP}$. The first output chopping circuit 12a further includes a first output electrically connected to an inverting input of the output amplification circuit 41, to a first end of the feedback capacitor 43, and to a first input of the second output chopping circuit 12b. The first output chopping circuit 12a further includes a second output electrically connected to a second input of the second output chopping circuit 12b, to a non-inverting input of the output amplification circuit 41, and to a first end of the integration capacitor 42. The integration capacitor 42 further includes a second end electrically connected to the first supply voltage $V_1$. The feedback capacitor 43 further includes a second end electrically connected to an output of the output amplification circuit 41 and to the output terminal $V_{OUT}$.

The second output chopping circuit 12b further includes a clock input configured to receive the chopping clock signal $CLK_{CHOP}$, a first output electrically connected to a drain of the first NMOS cascode transistor 33, and a second output electrically connected to a drain of the second NMOS cascode transistor 34. The first NMOS cascode transistor 33 further includes a gate electrically connected to a third reference voltage $V_{REF3}$ and to a gate of the second NMOS cascode transistor 34. The first NMOS cascode transistor 33 further includes a source electrically connected to a drain of the first NMOS load transistor 31. The second NMOS cascode transistor 34 further includes a source electrically connected to a drain of the second NMOS load transistor 32. The first NMOS load transistor 31 further includes a source electrically connected to the first supply voltage $V_1$ and a gate electrically connected to a fourth reference voltage $V_{REF4}$ and to a gate of the second NMOS load transistor 32. The second NMOS load transistor 32 further includes a source electrically connected to the first supply voltage $V_1$.

In the illustrated configuration, the first differential transistor bank 14 is used to operate as a differential input transistor pair of the chopper amplifier 50. The first differential transistor bank 14 includes a plurality of transistors. A first portion of the transistors can operate in a first transistor group associated with the bank's first drain terminal, first gate terminal, and common source terminal, and a second portion of the transistors can operate in a second transistor group associated with the bank's second drain terminal, second gate terminal, and common source terminal. For example, the first portion of the transistors can have drains electrically connected to the first drain terminal, gates electrically connected to the first gate terminal, and sources electrically connected to the common source terminal. Additionally, the second portion of the transistors can have drains electrically connected to the second drain terminal, gates electrically connected to the second gate terminal, and sources electrically connected to the common source terminal. Two example implementations of the first differential transistor bank 14 will be described further below with reference to FIGS. 8A-8B.

FIG. 2 illustrates one example of a chopper amplifier that can include a differential transistor bank. The first differential transistor bank 14 can be programmed using the first control signal CTL1 to operate with a particular transistor configuration having low input offset. Although the chopper amplifier 50 of FIG. 2 illustrates one example of a chopper amplifier that can include a differential transistor bank, the teachings herein are applicable a wide variety of chopper amplifiers, including, for example, chopper amplifiers implemented using other circuit topologies.

Additionally, although FIG. 2 illustrates a configuration in which the first differential transistor bank 14 is associated with n-type input transistors, the teachings herein are applicable to configuration using p-type input transistors, and/or a combination of n-type and p-type input transistors.

Figure 3:
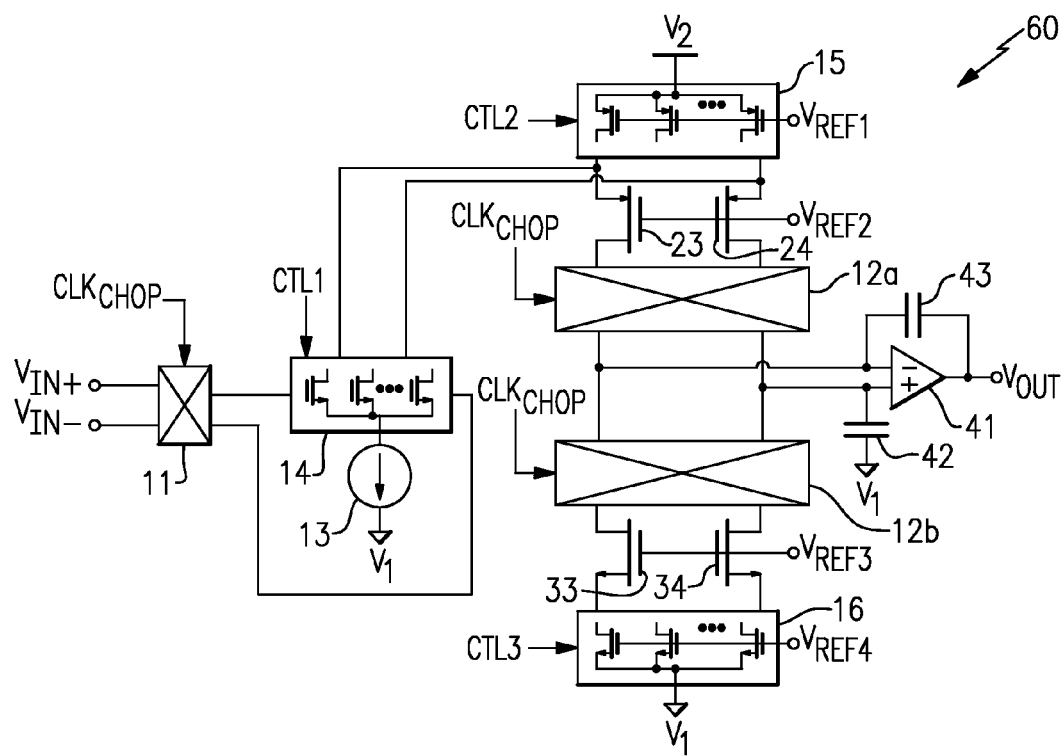

FIG. 3 is a circuit diagram of a chopper amplifier 60 according to another embodiment. The chopper amplifier 60 of FIG. 3 is similar to the chopper amplifier 50 of FIG. 2, except that the chopper amplifier 60 illustrates a configuration in which the first and second PMOS load transistors 21, 22 of FIG. 2 have been omitted in favor of including a second differential transistor bank 15, and in which the first and second NMOS load transistors 31, 32 of FIG. 2 have been omitted in favor of including a third differential transistor bank 16.

As shown in FIG. 3, the second differential transistor bank 15 includes a control terminal configured to receive a second control signal CTL2, a common source terminal electrically connected to the second supply voltage $V_2$, a first drain terminal electrically connected to the source of the first PMOS cascode transistor 23, a second drain terminal electrically connected to the source of the second PMOS cascode transistor 24, and a common gate terminal electrically connected to the first reference voltage $V_{REF1}$. Additionally, the third differential transistor bank 16 includes a control terminal configured to receive a third control signal CTL3, a common source terminal electrically connected to the first supply voltage $V_1$, a first drain terminal electrically connected to the source of the first NMOS cascode transistor 33, a second drain terminal electrically connected to the source of the second NMOS cascode transistor 34, and a common gate terminal electrically connected to the fourth reference voltage $V_{REF4}$.

The second control signal CTL2 can be used to control the transistor configuration of the second differential transistor bank 15. Additionally, the third control signal CTL3 can be used to control the transistor configuration of the third differential transistor bank 16. The second and third control signals CTL2, CTL3 can be generated by a programmable memory, such as the programmable memory 9 of FIG. 1A.

Including a plurality of differential transistor banks can aid in further reducing a chopper amplifier's input offset relative to a single bank configurations. In the illustrated configuration, the first, second, and third differential transistor banks 14-16 can be separately configured using the first, second, and third control signals CTL1-CTL3, respectively, to calibrate the amplifier with low input offset.

Figure 4A:
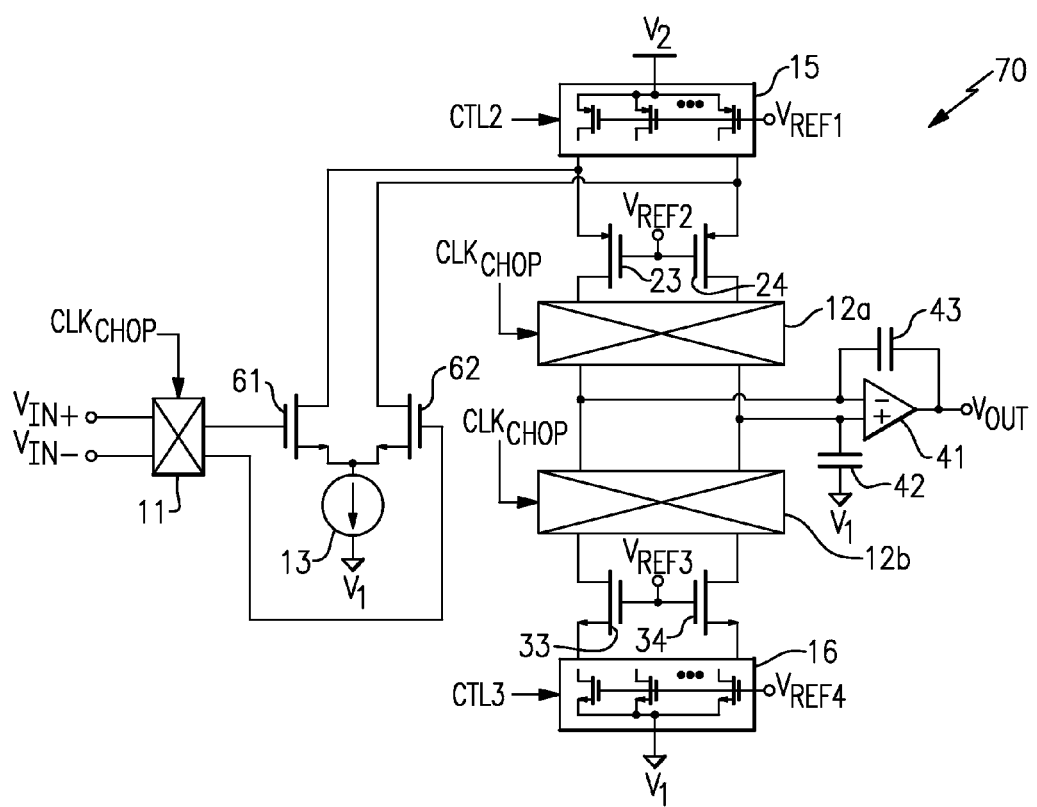

FIG. 4A is a circuit diagram of a chopper amplifier 70 according to another embodiment. The chopper amplifier 70 of FIG. 4A is similar to the chopper amplifier 60 of FIG. 3, except that the chopper amplifier 70 illustrates a configuration in which the first differential transistor bank 14 of FIG. 3 has been omitted in favor of including the first and second NMOS input transistors 61, 62, which operate as the chopper amplifier's differential input transistor pair.

As shown in FIG. 4A, the sources of the first and second NMOS input transistors 61, 62 are connected to one another, and can receive the bias current from the current source 13. Additionally, the gates of the first and second NMOS input transistors 61, 62 are electrically connected to the first and second outputs of the input chopping circuit 11, respectively. Furthermore, the drains of the first and second NMOS input transistors 61, 62 are electrically connected to the first and second drain terminals of the second differential transistor bank 15, respectively.

The differential transistor banks described herein can be included in a wide variety of arrangements in a chopper amplifier. For example, in the illustrated configuration, differential transistor banks operate as the chopper amplifier's load transistors. However, the teachings herein are applicable to a wide variety of configurations, including, for example, configurations in which differential transistor banks operate as differential input pair transistors, differential load transistors, and/or differential cascode transistors of a chopper amplifier.

Figure 4B:
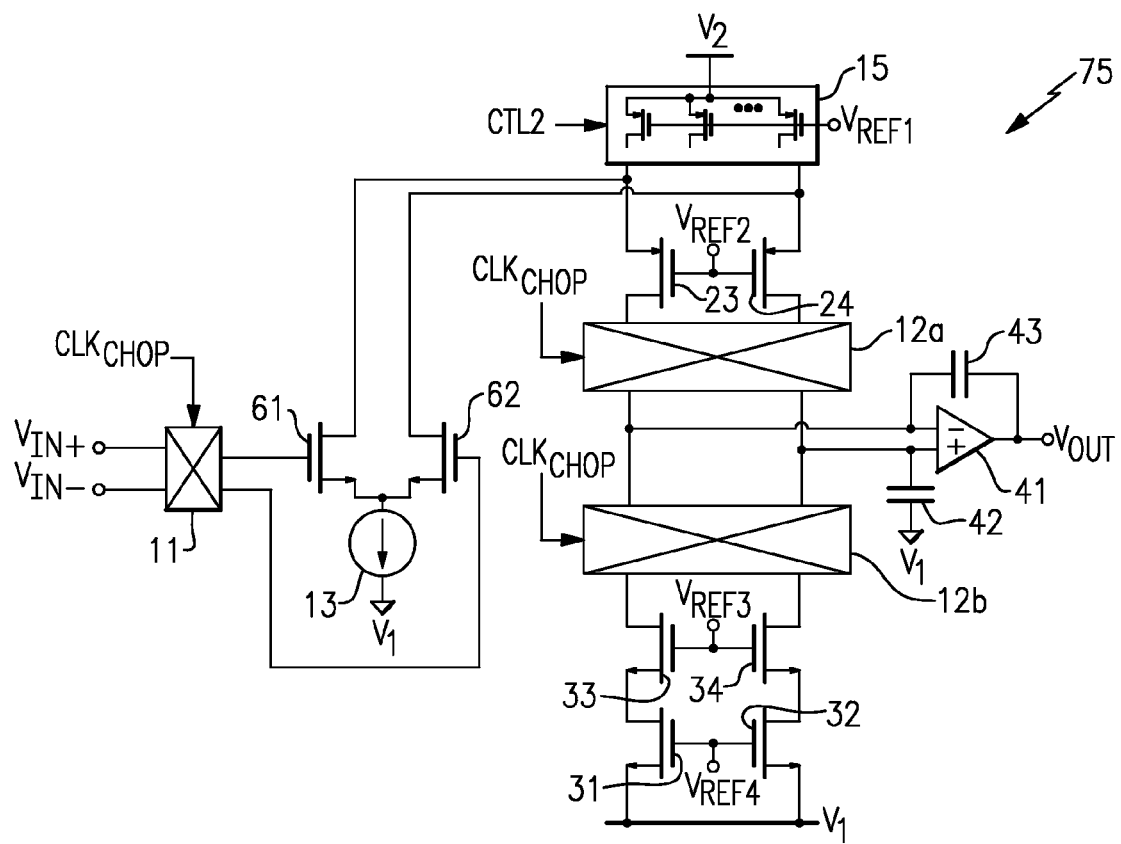

FIG. 4B is a circuit diagram of a chopper amplifier 75 according to another embodiment. The chopper amplifier 75 of FIG. 4B is similar to the chopper amplifier 70 of FIG. 4A, except that the chopper amplifier 75 illustrates a configuration in which the third differential transistor bank 16 of FIG. 4A has been omitted in favor of including the first and second NMOS load transistors 31, 32.

In certain implementations, a differential transistor bank can be used for PMOS load transistors but not for NMOS load transistors, or vice versa. Additional details of the chopper amplifier 75 can be similar to those described earlier.

Figure 5A:
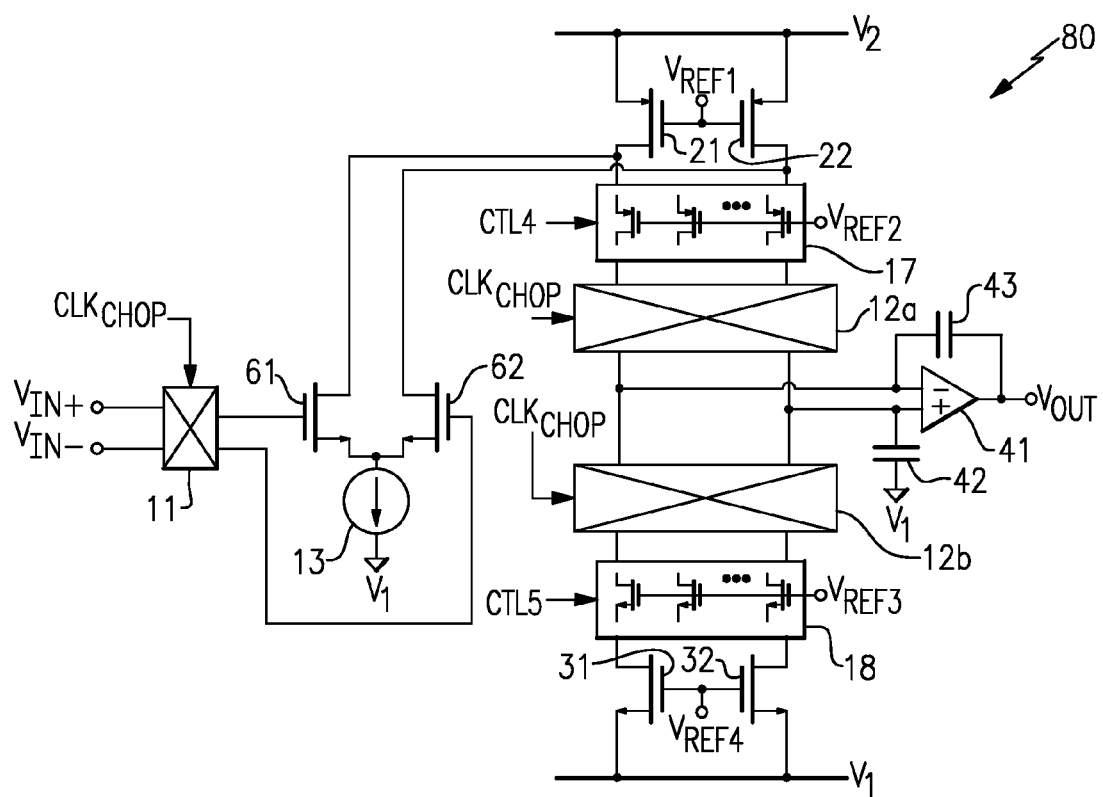

FIG. 5A is a circuit diagram of a chopper amplifier 80 according to another embodiment. The chopper amplifier 80 of FIG. 5A is similar to the chopper amplifier 50 of FIG. 2, except that the chopper amplifier 80 illustrates a configuration in which the first differential transistor bank 14 of FIG. 2 has been omitted in favor of including the first and second NMOS input transistors 61, 62. Additionally, the chopper amplifier 80 illustrates a configuration in which the first and second PMOS cascode transistors 23, 24 of FIG. 2 have been omitted in favor of including a fourth differential transistor bank 17, and in which the first and second NMOS cascode transistors 33, 34 of FIG. 2 have been omitted in favor of including a fifth differential transistor bank 18.

As shown in FIG. 5A, the fourth differential transistor bank 17 includes a control terminal configured to receive a fourth control signal CTL4, a first source terminal electrically connected to the drain of the first PMOS load transistor 21, a second source terminal electrically connected to the drain of the second PMOS load transistor 22, a first source terminal electrically connected to the first input of the first output chopping circuit 12a, a second source terminal electrically connected to the second input of the first output chopping circuit 12a, and a common gate terminal electrically connected to the second reference voltage $V_{REF2}$. Additionally, the fifth differential transistor bank 18 includes a control terminal configured to receive a fifth control signal CTL5, a first source terminal electrically connected to the drain of the first NMOS load transistor 31, a second source terminal electrically connected to the drain of the second NMOS load transistor 32, a first drain terminal electrically connected to the first output of the second output chopping circuit 12b, a second drain terminal electrically connected to the second output of the second output chopping circuit 12b, and a common gate terminal electrically connected to the third reference voltage $V_{REF3}$.

The fourth control signal CTL4 can be used to control the transistor configuration of the fourth differential transistor bank 17. Additionally, the fifth control signal CTL5 can be used to control the transistor configuration of the fifth differential transistor bank 18. The fourth and fifth control signals CTL4, CTL5 can be generated by a programmable memory, such as the programmable memory 9 of FIG. 1A. The illustrated configuration omits the first, second, and third differential transistor banks 14-16 of FIG. 3. However, the teachings herein are applicable to a variety of configurations, including, for example, configurations including any combination of the first, second, third, fourth, and/or fifth differential transistor banks 14-18. Additional details of the chopper amplifier 80 can be similar to those described earlier.

Figure 5B:
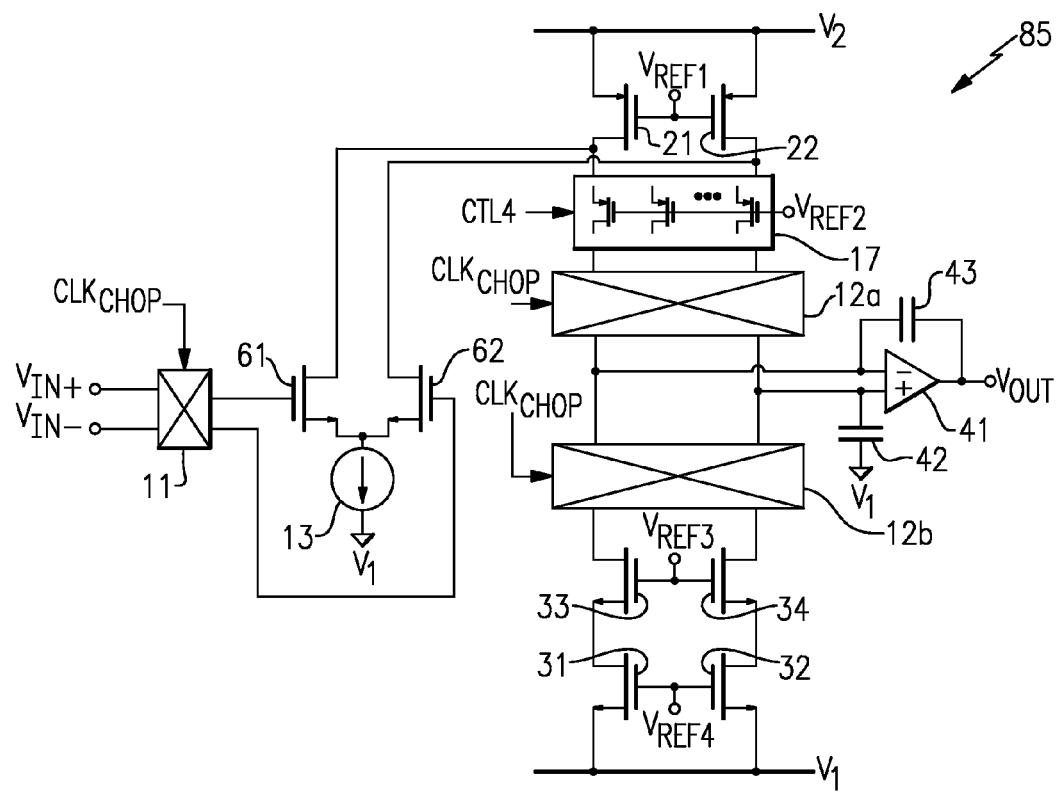

FIG. 5B is a circuit diagram of a chopper amplifier 85 according to another embodiment. The chopper amplifier 85 of FIG. 5B is similar to the chopper amplifier 80 of FIG. 5A, except that the chopper amplifier 85 illustrates a configuration in which the fifth differential transistor bank 18 of FIG. 5A has been omitted in favor of including the first and second NMOS cascode transistors 33, 34.

In certain implementations, a differential transistor bank can be used for PMOS cascode transistors but not for NMOS cascode transistors, or vice versa. Additional details of the chopper amplifier 85 can be similar to those described earlier.

Figure 5C:
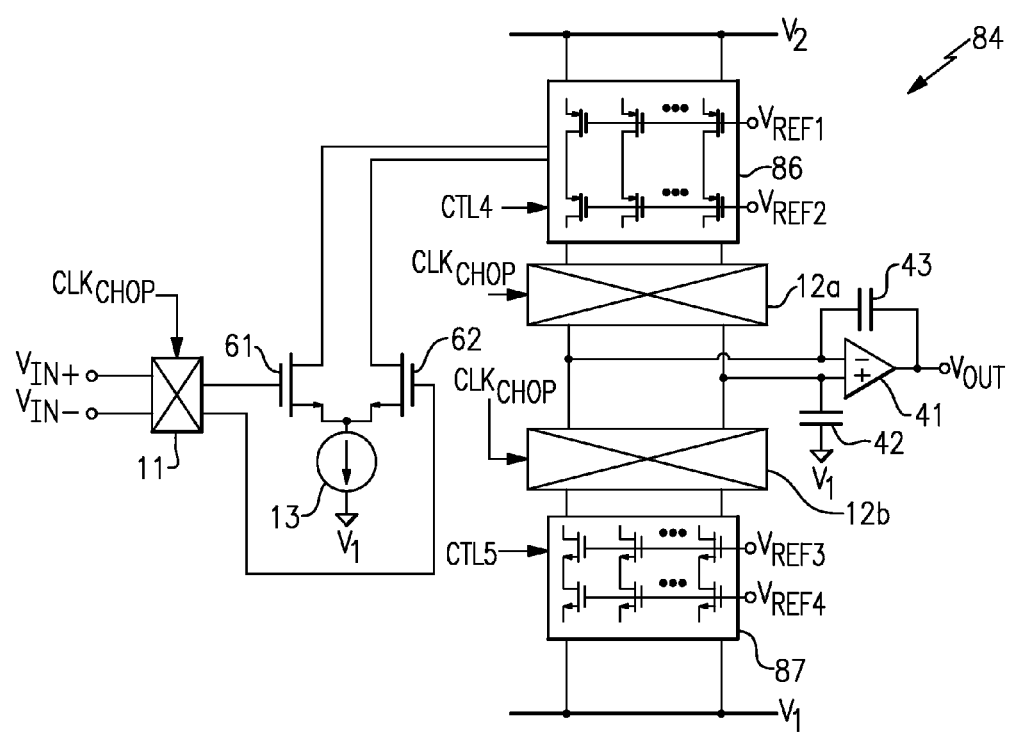

FIG. 5C is a circuit diagram of a chopper amplifier 84 according to another embodiment. The chopper amplifier 84 includes the input chopping circuit 11, the first output chopping circuit 12*a*, the second output chopping circuit 12*b*, the current source 13, the output amplification circuit 41, the integration capacitor 42, the feedback capacitor 43, and the first and second NMOS input transistors 61, 62, which can be as described earlier. The chopper amplifier 84 further includes a first differential transistor bank 86 and a second differential transistor bank 87.

In certain implementations, a differential transistor bank can include a combination of cascode transistors, load transistor, and/or input transistors that are grouped or paired.

For example, in the illustrated configuration, the first differential transistor bank 86 includes a plurality of PMOS load transistors and a plurality of PMOS cascode transistors that are grouped with one another. In particular, the plurality of PMOS load transistors and the plurality of PMOS cascode transistors are implemented such that a drain of a particular PMOS load transistor is tied to a source of a respective PMOS cascode transistor. Similarly, the second differential transistor bank 87 includes a plurality of NMOS load transistors and a plurality of NMOS cascode transistors that are grouped with one another. In particular, the plurality of NMOS load transistors and the plurality of NMOS cascode transistors are implemented such that a drain of a particular NMOS load transistor is tied to a source of a respective NMOS cascode transistor.

In the illustrated configuration, the control signal CTL4 can be used to select a first portion of the transistor pairs of the first differential transistor bank 86 to electrically connect between the drain of the first NMOS input transistor 61 and the first input of the first output chopping circuit 12*a*, and to select a second portion of the transistor pairs of the first differential transistor bank 86 to electrically connect between the drain of the second NMOS input transistor 62 and the second input of the first output chopping circuit 12*a*. Additionally, the control signal CTL5 can be used to select a first portion of the transistor pairs of the second differential transistor bank 87 to electrically connect between the first input of the second output chopping circuit 12*b* and the first supply voltage $V_1$, and to select a second portion of the transistor pairs of the second differential transistor bank 87 to electrically connect between the second input of the second output chopping circuit 12*b* and the first supply voltage $V_1$.

Although illustrated in the context of differential transistor banks comprising transistor groups that each include a cascode transistor and a load transistor, other configurations are possible. For example, a differential transistor bank can include cascode transistors, load transistors, and/or input transistors that are grouped or paired. Furthermore, in certain configuration, degeneration resistors are grouped or paired with the transistors of a differential transistor bank.

Additional details of the chopper amplifier 84 can be similar to those described earlier.

Figure 5D:
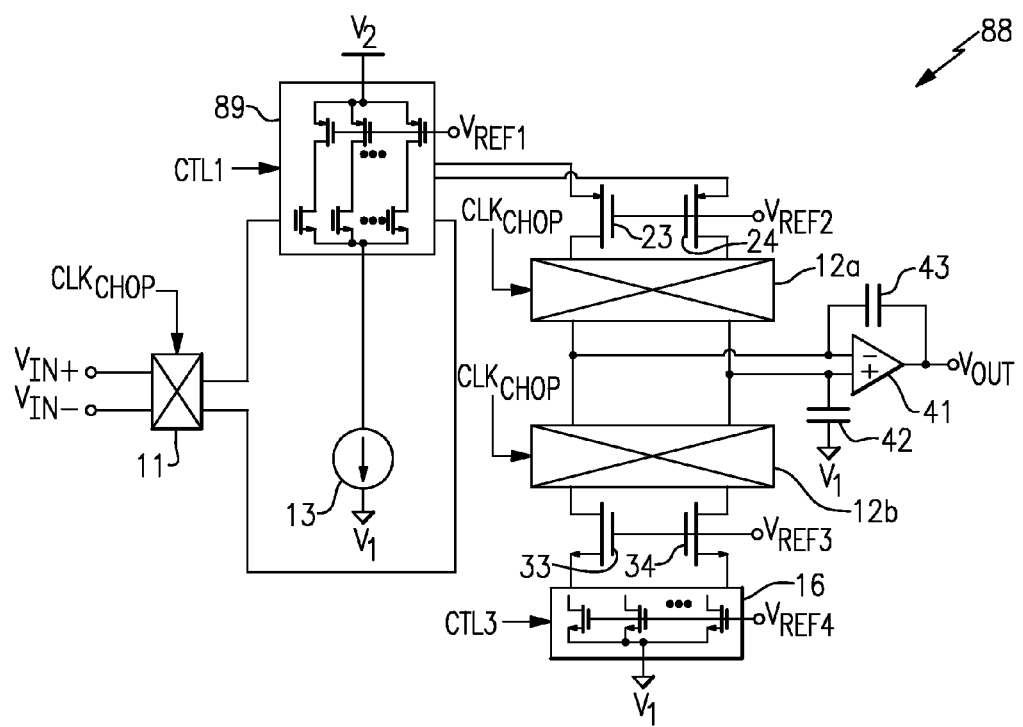

FIG. 5D is a circuit diagram of a chopper amplifier 88 according to another embodiment. The chopper amplifier 88 includes the input chopping circuit 11, the first output chopping circuit 12*a*, the second output chopping circuit 12*b*, the current source 13, the differential transistor bank 16, the first and second PMOS cascode transistors 23, 24, the first and second NMOS cascode transistors 33, 34, the output amplification circuit 41, the integration capacitor 42, and the feedback capacitor 43, which can be as described earlier. The chopper amplifier 88 further includes a differential transistor bank 89.

In the illustrated configuration, the differential transistor bank 89 includes a plurality of NMOS input transistors and a plurality of PMOS load transistors that are paired with one another. In particular, the plurality of NMOS input transistors and the plurality of PMOS load transistors are implemented such that a drain of a particular NMOS input transistor is tied to a drain of a respective PMOS load transistor. Additionally, the control signal CTL1 can be used to select a first portion of the transistor pairs of the differential transistor bank 89 to electrically connect between the first output of the input chopping circuit 12 and the source of the first PMOS cascode transistor 23, and to select a second portion of the transistor pairs of the differential transistor bank 89 to electrically connect between the second output of the input chopping circuit 12 and the source of the second PMOS cascode transistor 24.

Although illustrated in the context of a differential transistor bank comprising transistors groups that each include an input transistor and a load transistor, other configurations are possible. For example, in one embodiment, a differential transistor bank comprises a plurality of transistor groups each including an input transistor and a load transistor. In another embodiment, a differential transistor bank comprises a plurality of transistor groups each including a load transistor and a cascode transistor. In yet another embodiment, a differential transistor bank comprises a plurality of transistor groups each including an input transistor, a cascode transistor, and a load transistor.

Additional details of the chopper amplifier 88 can be similar to those described earlier.

Figure 6:
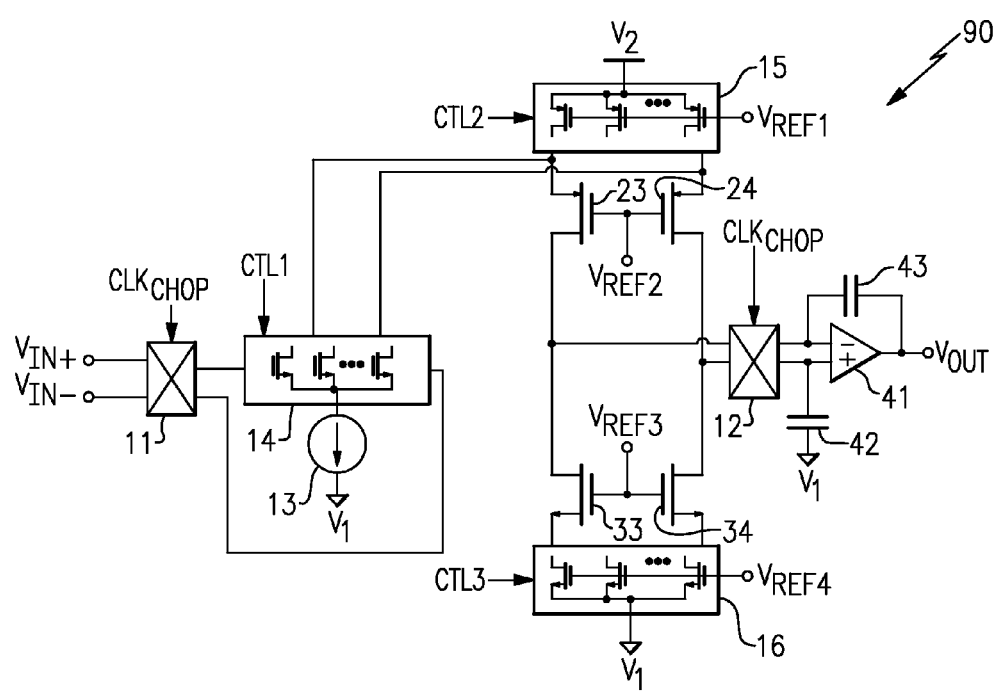

FIG. 6 is a circuit diagram of a chopper amplifier 90 according to another embodiment. The chopper amplifier 90 of FIG. 6 is similar to the chopper amplifier 60 of FIG. 3, except that the chopper amplifier 90 illustrates a different configuration of output chopping circuitry. For example, in contrast to the chopper amplifier 60 of FIG. 3 that includes the first and second output chopping circuits 12*a*, 12*b*, the chopper amplifier 90 includes an output chopping circuit 12.

As shown in FIG. 6, the output chopping circuit 12 includes a first input electrically connected to the drain of the first PMOS cascode transistor 23 and to the drain of the first NMOS cascode transistor 33, a second input electrically connected to the drain of the second PMOS cascode transistor 24 and to the drain of the second NMOS cascode transistor 34, a clock input configured to receive the chopping clock signal $CLK_{CHOP}$, a first output electrically connected to the inverting input of the output amplification circuit 41 and to the first end of the feedback capacitor 43, and a second output electrically connected to the non-inverting input of the output amplification circuit 41 and to the first end of the integration capacitor 42.

As persons of ordinary skill in the art will appreciate, the teachings herein are applicable to a wide variety of input and output chopping configurations. For example, the chopper amplifiers herein can include multiple input and/or output chopping circuits. Additionally, in certain configurations, one or more of the input and/or output chopping circuits can receive different clock signals, such as clock signals with different delays, overlaps, non-overlaps, and/or phases.

Furthermore, as will be described in detail further below with reference to FIGS. 10-12, in certain implementations, a chopping circuit can be integrated with a differential transistor bank. Integrating a chopping circuit and a differential transistor bank can reduce a number of switches in a signal path relative to a scheme in which the chopper amplifier includes a separate input chopping circuit and differential transistor bank.

Figure 7:
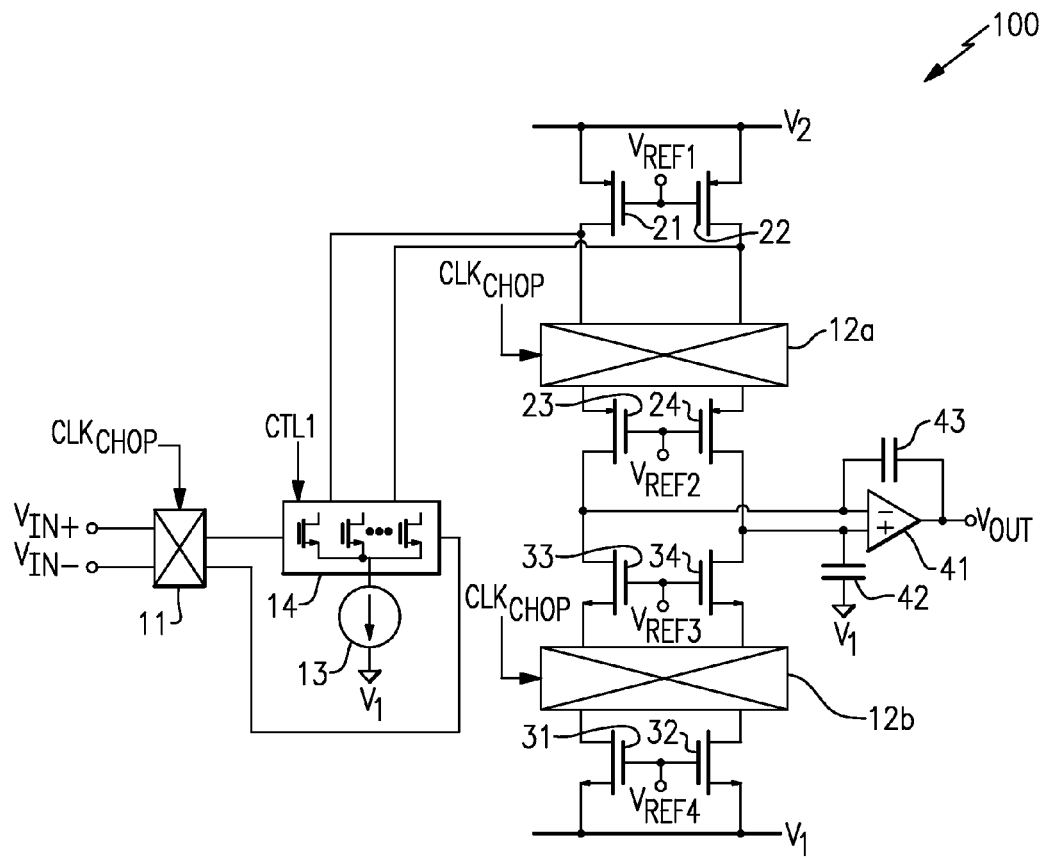

FIG. 7 is a circuit diagram of a chopper amplifier 100 according to another embodiment. The chopper amplifier 100 of FIG. 7 is similar to the chopper amplifier 50 of FIG. 2, except that the chopper amplifier 100 illustrates a different configuration of the first and second output chopping circuits 12a, 12b.

For example, in configuration shown in FIG. 7, the first and second inputs of the first output chopping circuit 12a are electrically connected to drains of the first and second PMOS load transistors 21, 22, respectively. Additionally, the first and second outputs of the first output chopping circuit 12a are electrically connected to sources of the first and second PMOS cascode transistors 23, 24, respectively. Furthermore, the first and second inputs of the second output chopping circuit 12b are electrically connected to the sources of the first and second NMOS cascode transistors 33, 34, respectively. Additionally, the first and second outputs of the second output chopping circuit 12b are electrically connected to the drains of the first and second NMOS load transistors 31, 32, respectively. Additional details of the chopper amplifier 100 can be similar to those described earlier.

FIGS. 8A-8D are circuit diagrams of differential transistor banks according to various embodiments.

Figure 8A:
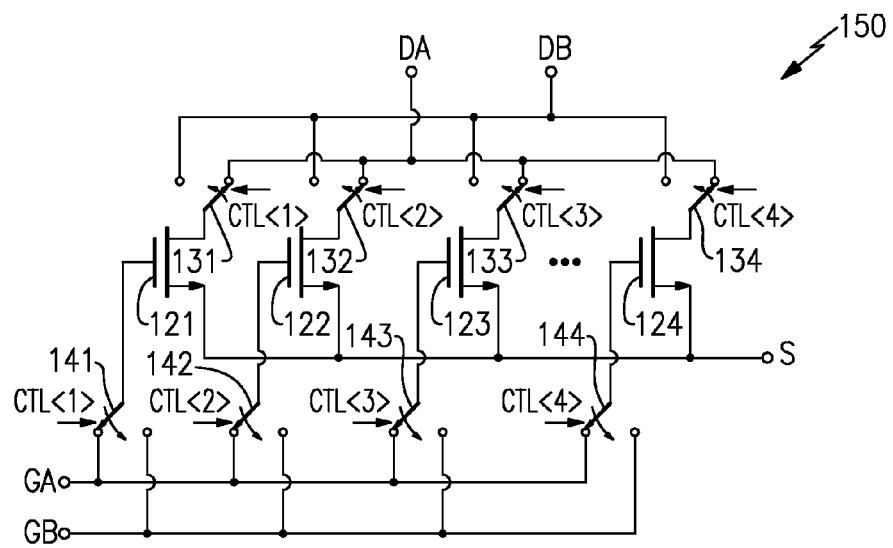
FIGS. 8A-8D are circuit diagrams of differential transistor banks according to various embodiments.

FIG. 8A is circuit diagram of a differential transistor bank 150 according to one embodiment. The differential transistor bank 150 includes a common source terminal S, a first gate terminal GA, a second gate terminal GB, a first drain terminal DA, a second drain terminal DB, first to fourth NMOS transistors 121-124, first to fourth drain selection switches 131-134, and first to fourth gate selection switches 141-144. The differential transistor bank 150 is configured to receive a control signal having a first control bit CTL<1>, a second control bit CTL<2>, a third control bit CTL<3>, and a fourth control bit CTL<4>. The differential transistor bank 150 illustrates one example implementation of the first differential transistor bank 14 of FIGS. 2, 3, 6, and 7.

In the configuration shown in FIG. 8A, the sources of the first to fourth NMOS transistors 124-124 are electrically to the common source terminal S. Additionally, the first to fourth drain selection switches 131-134 and the first to fourth gate selection switches 141-144 operate as a selection circuit that can be controlled using the bank's control signal. For example, the first to fourth drain selection switches 131-134 can be used to selectively connect the drains of the first to fourth NMOS transistors 121-124 to either the first drain terminal DA or the second drain terminal DB based on the state of the first control bit CTL<1>, the second control bit CTL<2>, the third control bit CTL<3>, and the fourth control bit CTL<4>, respectively. Additionally, the first to fourth gate selection switches 141-144 can be used to selectively connect the gates of the first to fourth NMOS transistors 121-124 to either the first gate terminal GA or the second gate terminal GB based on the state of the first control bit CTL<1>, the second control bit CTL<2>, the third control bit CTL<3>, and the fourth control bit CTL<4>, respectively. The portion of the transistors connected to the first drain terminal DA and the first gate terminal GA can be associated with a first transistor group, and the portion of the transistors connected to the second drain terminal DB and the second gate terminal GB can be associated with a second transistor group.

In certain implementations, the first to fourth NMOS transistors 121-124 are designed with the same drive-strength and/or geometry. The first to fourth drain selection switches 131-134 and the first to fourth gate selection switches 141-144 can be used to connect a first portion of the NMOS transistors 121-124 to the first drain terminal DA and the first gate terminal GA, and to connect a second portion of the NMOS transistors 121-124 to the second drain terminal DB and the second gate terminal GB. In certain implementations, the selected configuration of transistors can be determined during factory test and can be retained in an on-chip programmable memory.

Although FIG. 8A illustrates a configuration using four NMOS transistors and associated selection circuitry, the differential transistor bank can be adapted to include a different number of transistors. In one embodiment, the differential transistor bank 150 includes between about 4 and about 24 transistors.

Figure 8B:
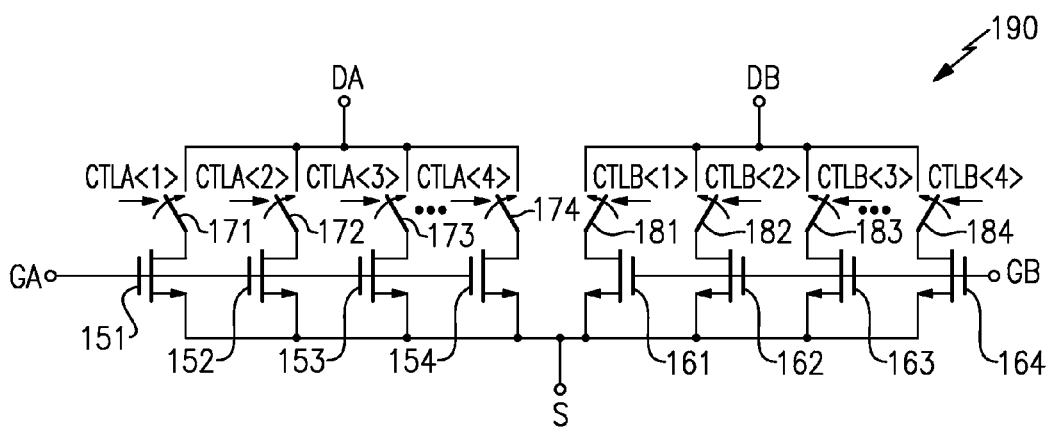

FIG. 8B is a circuit diagram of a differential transistor bank 190 according to another embodiment. The differential transistor bank 190 includes a common source terminal S, a first gate terminal GA, a second gate terminal GB, a first drain terminal DA, a second drain terminal DB, first to fourth NMOS transistors 151-154, fifth to eighth NMOS transistors 161-164, first to fourth drain selection switches 171-174, and fifth to eighth drain selection switches 181-184. The differential transistor bank 190 is configured to receive a control signal having control bits CTLA<1>, CTLA<2>, CTLA<3>, CTLA<4>, CTLB<1>, CTLB<2>, CTLB<3>, and CTLB<4>. The differential transistor bank 190 illustrates another example implementation of the first differential transistor bank 14 of FIGS. 2, 3, 6, and 7.

In the configuration shown in FIG. 8B, the gates of the first to fourth NMOS transistors 151-154 are electrically connected to the first gate terminal GA, the gates of the fifth to eighth NMOS transistors 161-164 are electrically connected to the second gate terminal GB, and the sources of the first to eighth NMOS transistors 151-154, 161-164 are electrically connected to the common source terminal S. Additionally, the first to fourth drain selection switches 171-174 can be used to selectively connect a portion of the first to fourth NMOS transistors 151-154 to the first drain terminal DA to form a first transistor group. Additionally, the fifth to eighth drain selection switches 181-184 can be used to selectively connect a portion of the fifth to eighth NMOS transistors 161-164 to the second drain terminal DB to form a second transistor group. The first to eighth drain selection switches 171-174, 181-184 can select a particular transistor configuration based on a state of the control bits CTLA<1>, CTLA<2>, CTLA<3>, CTLA<4>, CTLB<1>, CTLB<2>, CTLB<3>, and CTLB<4>, respectively.

Although FIG. 8B illustrates a configuration in which the differential transistor bank includes four transistors in two sets or pools, other configurations including more or fewer transistors can be used. Furthermore, in certain implementations, each of the sets can include a different number of transistors.

Figure 8C:
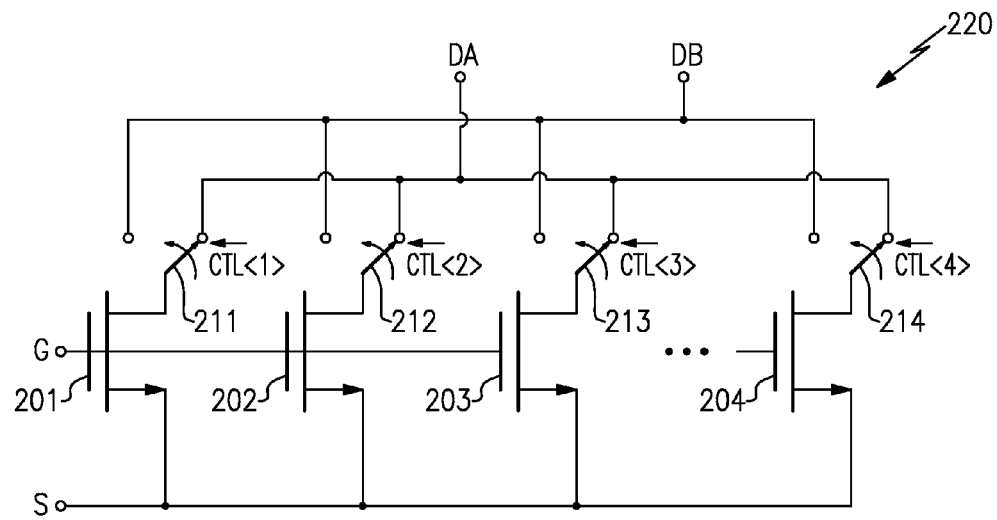

FIG. 8C is circuit diagram of a differential transistor bank 220 according to another embodiment. The differential transistor bank 220 includes a common source terminal S, a common gate terminal G, a first drain terminal DA, a second drain terminal DB, first to fourth NMOS transistors 201-204, and first to fourth drain selection switches 211-214. The differential transistor bank 220 is configured to receive a control signal having a first control bit CTL<1>, a second control bit CTL<2>, a third control bit CTL<3>, and a fourth control bit CTL<4>. The differential transistor bank 220 illustrates one example implementation of the third differential transistor bank 16 of FIGS. 3, 4, and 6.

In the configuration shown in FIG. 8C, the sources of the first to fourth NMOS transistors 201-204 are electrically to the common source terminal S, and the gates of the first to fourth NMOS transistors 201-204 are electrically connected to the common gate terminal G. Additionally, the first to fourth drain selection switches 211-214 can selectively control connection between the drains of the first to fourth NMOS transistors 201-204 and the first or second drain terminals DA, DB using the first control bit CTL<1>, the second control bit CTL<2>, the third control bit CTL<3>, and the fourth control bit CTL<4>, respectively. The portion of the transistors connected to the first drain terminal DA can be associated with a first transistor group, and the portion of the transistors connected to the second drain terminal DB can be associated with a second transistor group. Additional details of the differential transistor bank 220 can be as described earlier.

Figure 8D:
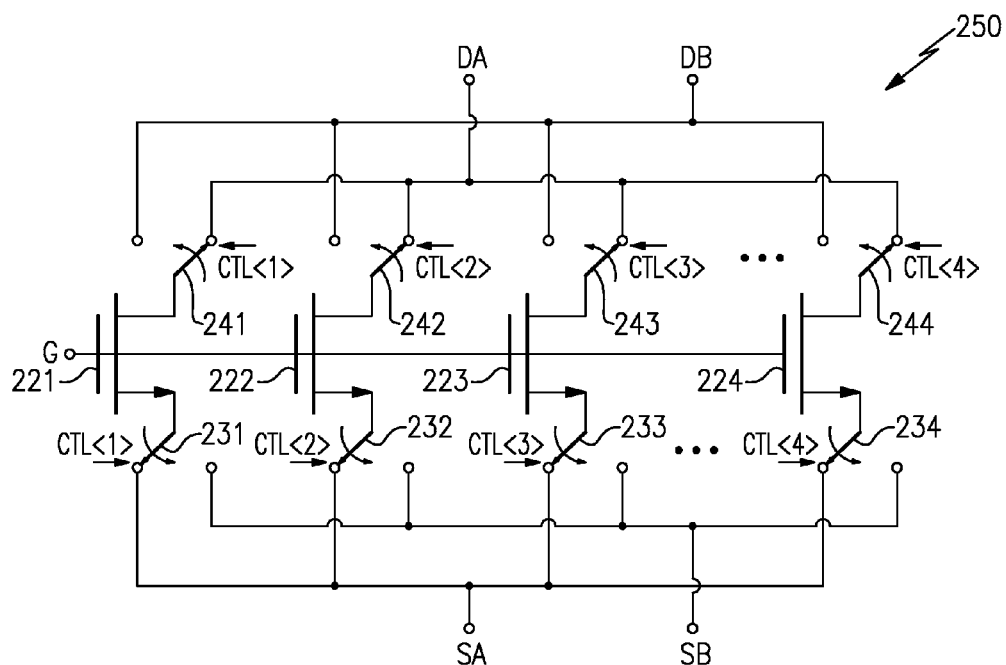

FIG. 8D is circuit diagram of a differential transistor bank 250 according to another embodiment. The differential transistor bank 250 includes a first source terminal SA, a second source terminal SB, a common gate terminal G, a first drain terminal DA, a second drain terminal DB, first to fourth NMOS transistors 221-224, first to fourth source selection switches 231-234, and first to fourth drain selection switches 241-244. The differential transistor bank 250 is configured to receive a control signal having a first control bit CTL<1>, a second control bit CTL<2>, a third control bit CTL<3>, and a fourth control bit CTL<4>. The differential transistor bank 250 illustrates one example implementation of the fifth differential transistor bank 18 of FIG. 5A.

In the configuration shown in FIG. 8D, the gates of the first to fourth NMOS transistors 221-224 are electrically to the common gate terminal G. Additionally, the first to fourth source selection switches 231-234 can selectively control connection between the sources of the first to fourth NMOS transistors 221-224 and the first or second source terminals SA, SB using the bank's control signal. Additionally, the first to fourth drain selection switches 241-244 can selectively control connection between the drains of the first to fourth NMOS transistors 221-224 and the first or second drain terminals DA, DB using the control signal. The portion of the NMOS transistors connected to the first source terminal SA and the first drain terminal DA can be associated with a first transistor group, and the portion of the NMOS transistors connected to the second source terminal SB and the second drain terminal DB can be associated with a second transistor group. Additional details of the differential transistor bank 250 can be as described earlier.

Although FIGS. 8A-8D illustrate differential transistor banks that include a plurality of n-type transistors, the teachings herein are applicable to configurations using p-type transistors or a combination of n-type and p-type transistors. For example, in one embodiment, the second differential transistor bank 15 of FIGS. 3, 4, and 6 is implemented using a complementary PMOS configuration of the NMOS differential transistor bank 220 of FIG. 8C. In another embodiment, the fourth differential transistor bank 17 of FIG. 5A is implemented using a complementary PMOS configuration of the NMOS differential transistor bank of FIG. 8D. In another embodiment, a chopper amplifier includes p-type differential input transistors, and includes a differential transistor bank implemented using a complementary PMOS configuration of the NMOS differential transistor bank of FIG. 8A or 8B.

Figure 9:
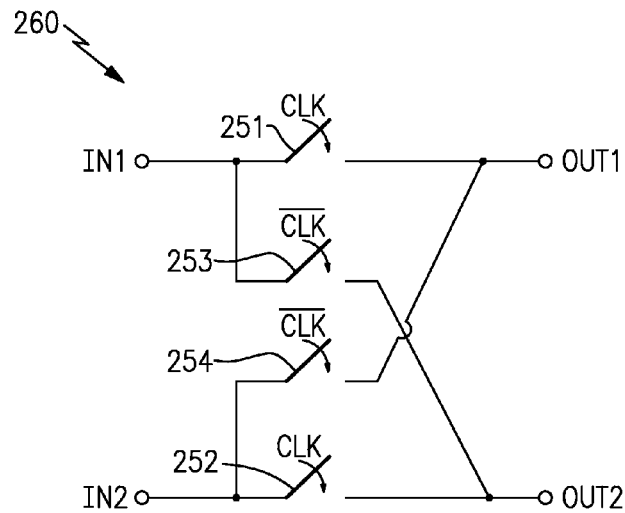
FIG. 9 is a circuit diagram of one implementation of a chopping circuit.

FIG. 9 is a circuit diagram of one implementation of a chopping circuit 260. The input chopping circuit includes first to fourth chopping switches 251-254. The first to fourth chopping switches 251-254 can be used to chop an input signal received between a first input IN1 and a second input IN2 to generate a chopped output signal between a first output OUT1 and a second output OUT2. The chopping circuit 260 of FIG. 9 illustrates one example implementation of the input and output chopping circuits described herein. However, other configurations are possible.

The first to fourth chopping switches 251-254 operate using a chopping clock signal that includes a first chopping clock signal phase (CLK) and a second chopping clock signal phase (CLK). For example, the first and second chopping switches 251, 252 can connect the first input IN1 to the first output OUT1 and the second input IN2 to the second output OUT2 during the first chopping clock signal phase. Additionally, the third and fourth chopping switches 253, 254 can connect the first input IN1 to the second output OUT2 and the second input IN2 to the first output OUT1 during the second chopping clock signal phase. In certain configurations, the first chopping clock signal phase and the second chopping clock signal phase can be non-overlapping.

In one embodiment, the first to fourth chopping switches 251-254 are implemented using MOS transistors, such as NMOS transistors, PMOS transistors, or a combination thereof.

Figure 10:
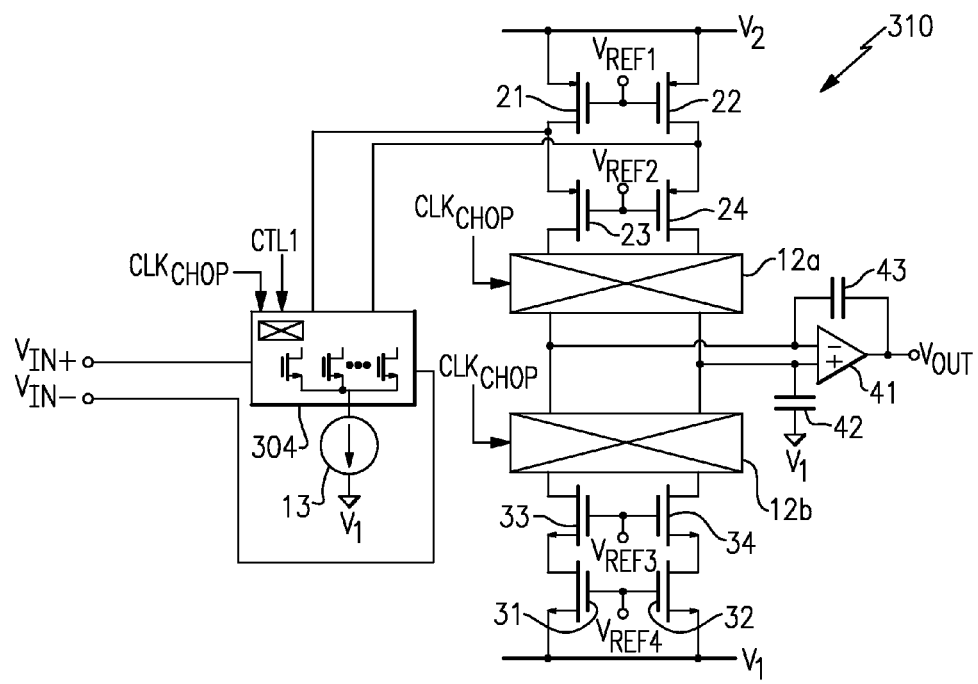
FIG. 10 is a circuit diagram of a chopper amplifier according to another embodiment.

FIG. 10 is a circuit diagram of a chopper amplifier 310 according to another embodiment. The chopper amplifier 310 of FIG. 10 is similar to the chopper amplifier 50 of FIG. 2, except that the chopper amplifier 310 illustrates a configuration in which the input chopping circuit 11 of FIG. 2 and the first differential transistor bank 14 of FIG. 2 are omitted in favor of using a chopping differential transistor bank 304.

As shown in FIG. 10, the chopping differential transistor bank 304 includes a first gate terminal electrically connected to the non-inverting input terminal $V_{INT+}$, a second gate terminal electrically connected to the inverting input terminal $V_{IN-}$, a control terminal configured to receive the first control signal CTL1, a clock terminal configured to receive the chopping clock signal $CLK_{CHOP}$, a common source terminal configured to receive the bias current from the current source 13, a first drain terminal electrically connected to the drain of the first PMOS load transistor 21 and to the source of the first PMOS cascode transistor 23, and a second drain terminal electrically connected to the drain of the second PMOS load transistor 22 and to the source of the second PMOS cascode transistor 24.

In certain implementations, a differential transistor bank can be integrated with an input chopping circuit to provide a chopping differential transistor bank, which can reduce a number of switches in a signal path relative to a scheme in which the chopper amplifier includes a separate input chopping circuit and differential transistor bank. Two example implementations of the chopping differential transistor bank 304 will be described further below with reference to FIGS. 12A-12B.

Figure 11:
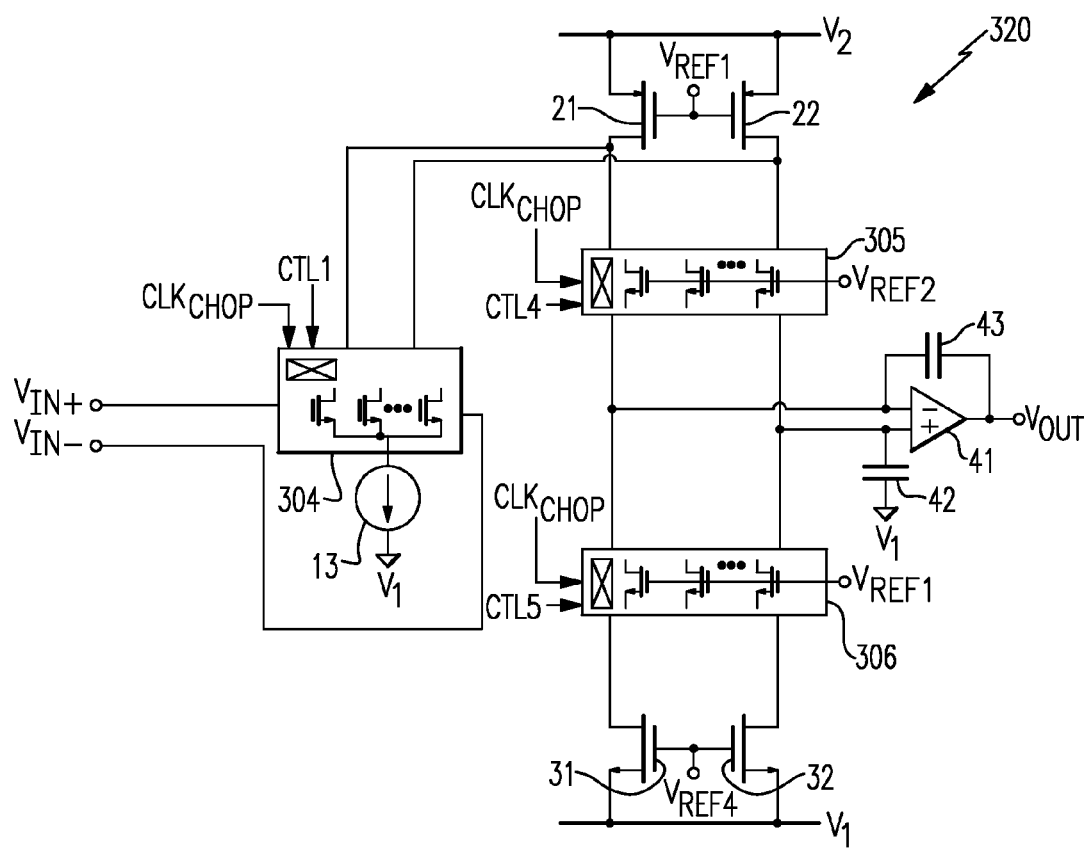
FIG. 11 is a circuit diagram of a chopper amplifier according to another embodiment.

FIG. 11 is a circuit diagram of a chopper amplifier 320 according to another embodiment. The chopper amplifier 320 of FIG. 11 is similar to the chopper amplifier 310 of FIG. 10, except that the chopper amplifier 310 illustrates a configuration in which the first and second PMOS cascode transistors 23, 24 and the first output chopping circuit 12a of FIG. 10 have been omitted in favor of including a second chopping differential transistor bank 305, and in which the first and second NMOS load transistors 31, 32 and the second output chopping circuit 12b of FIG. 10 have been omitted in favor of including a third chopping differential transistor bank 306.

As shown in FIG. 11, a chopper amplifier's input and/or output chopping circuitry can be integrated with one or more differential transistor banks, which can reduce a number of switches in the chopper amplifier's signal path. Additional details of the chopper amplifier 320 can be similar to those described earlier.

Figure 12A:
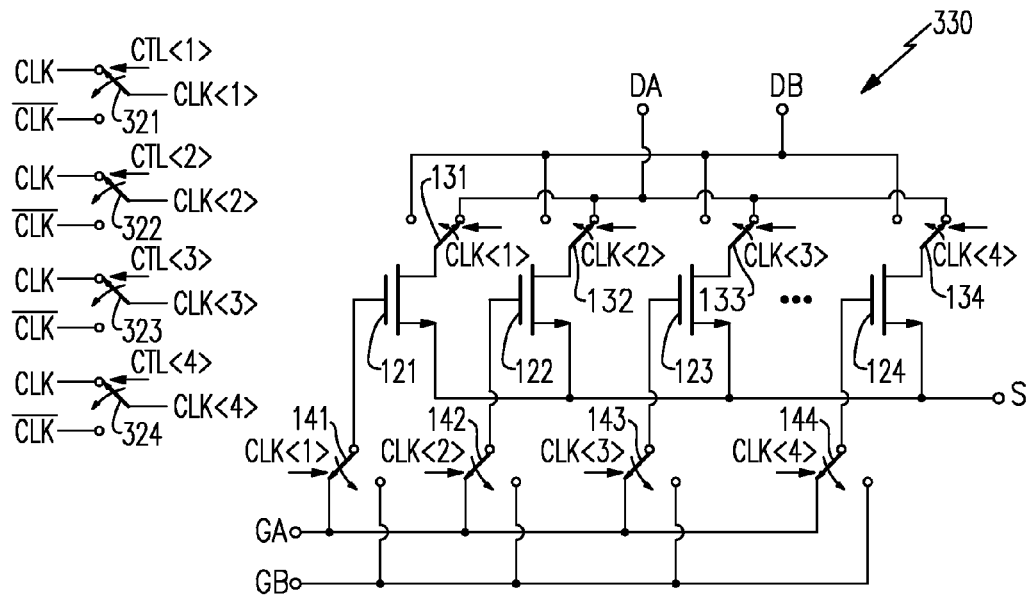
FIG. 12A is a circuit diagram of a chopping differential transistor bank according to one embodiment.

FIG. 12A is a circuit diagram of a chopping differential transistor bank 330 according to one embodiment. The chopping differential transistor bank 330 includes a common source terminal S, a first gate terminal GA, a second gate terminal GB, a first drain terminal DA, a second drain terminal DB, first to fourth NMOS transistors 121-124, first to fourth drain selection switches 131-134, first to fourth gate selection switches 141-144, and first to fourth chopping clock signal control switches 321-324. The chopping differential transistor bank 330 is configured to receive a chopping clock signal and to receive a control signal having a first control bit CTL<1>, a second control bit CTL<2>, a third control bit CTL<3>, and a fourth control bit CTL<4>. The differential transistor bank 330 illustrates one example implementation of the chopping differential transistor bank 304 of FIGS. 10-11.

The chopping differential transistor bank 330 of FIG. 12A is similar to the differential transistor bank 150 of FIG. 8A, except that the chopping differential transistor bank 330 further includes first to fourth chopping clock signal control switches 321-324, which are used to control the first to fourth drain selection switches 131-134 and the first to fourth gate selection switches 141-144. The first to fourth chopping clock signal control switches 321-324 operate as a multiplexer. Although one implementation of a multiplexer has been illustrated, persons having ordinary skill in the art will appreciate that multiplexing can be provided in other ways.

As shown in FIG. 12A, each of the first to fourth chopping clock signal control switches 321-324 can select between a first chopping clock signal phase (CLK) and a second chopping clock signal phase (CLK) of the chopping clock signal. However, skilled artisans will appreciate other configurations can be used.

The first chopping clock signal control switch 321 can generate a first clock signal CLK<1> by selecting between the first and second chopping clock signal phases using the first control bit CTL<1>. Additionally, the second chopping clock signal control switch 322 can generate a second clock signal CLK<2> by selecting between the first and second chopping clock signal phases using the second control bit CTL<2>. Furthermore, the third chopping clock signal control switch 323 can generate a third clock signal CLK<3> by selecting between the first and second chopping clock signal phases using the third control bit CTL<3>. Additionally, the fourth chopping clock signal control switch 324 can generate a fourth clock signal CLK<4> by selecting between the first and second chopping clock signal phases using the fourth control bit CTL<4>. As shown in FIG. 12A, the first clock signal CLK<1>, the second clock signal CLK<2>, the third clock signal CLK<3>, and the fourth clock signal CLK<4> can be used to control the switching operations of the first to fourth drain selection switches 131-134 and the first to fourth gate selection switches 141-144, respectively.

Figure 12B:
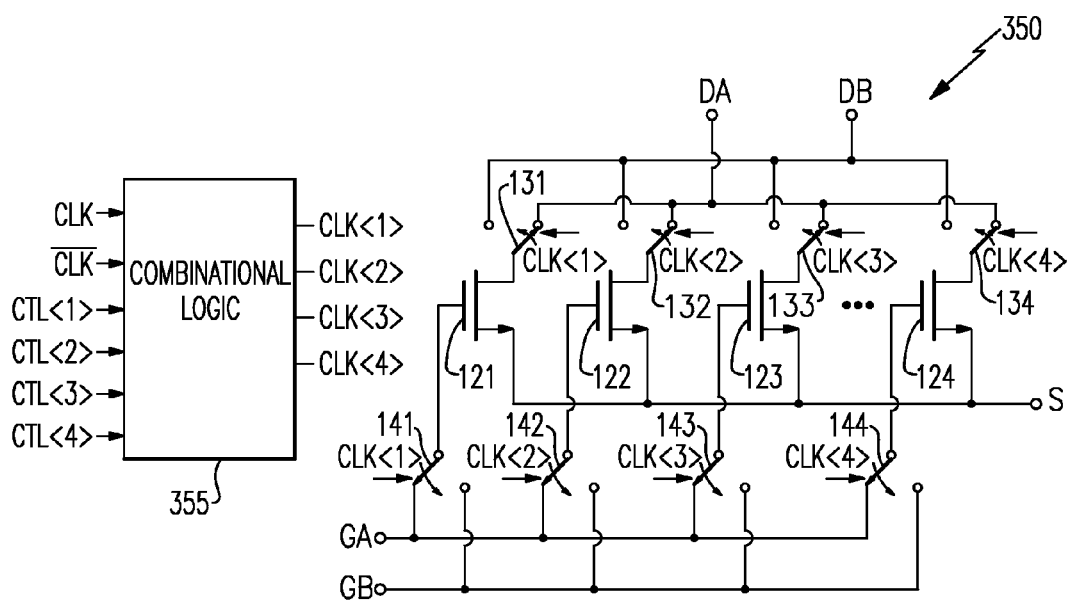
FIG. 12B is a circuit diagram of a chopping differential transistor bank according to another embodiment.

FIG. 12B is a circuit diagram of a chopping differential transistor bank 350 according to another embodiment. The chopping differential transistor bank 350 of FIG. 12B is similar to the chopping differential transistor bank 330 of FIG. 12A, except that the chopping differential transistor bank 350 omits the first to fourth chopping clock signal control switches 321-324 in favor of including combinational logic 355. Additional details of the chopping differential transistor bank 350 can be similar to those described above.

Figure 13:
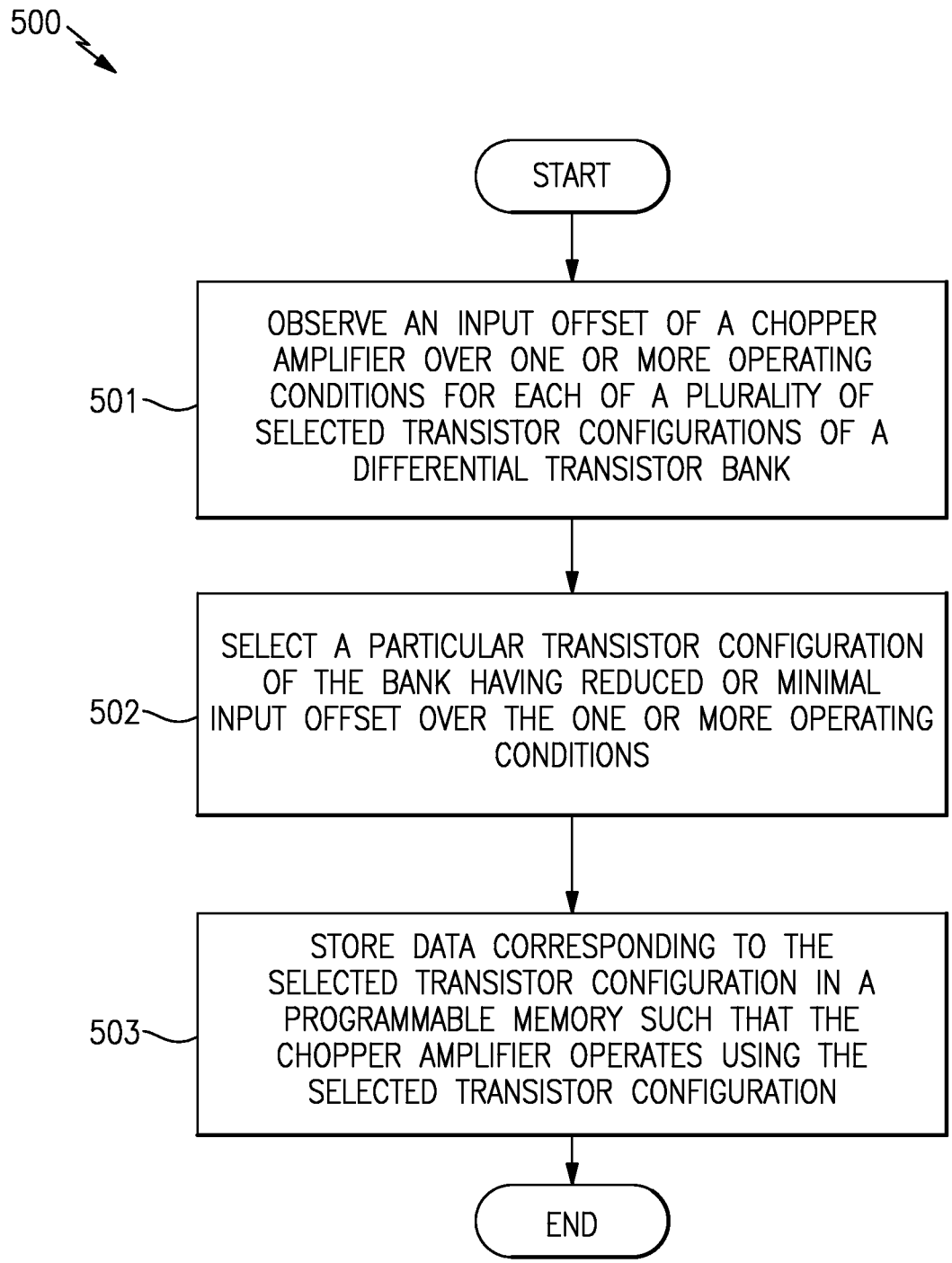
FIG. 13 is a flow diagram of a method of calibrating a chopper amplifier according to one embodiment.

FIG. 13 is a flow diagram of a method 500 of calibrating a chopper amplifier according to one embodiment. The method 500 can be used to calibrate, for example, any of the chopper amplifiers of FIG. 1A, 2-7, 10 or 11. It will be understood that the methods discussed herein may include greater or fewer operations.

The illustrated method 500 of calibrating a chopper amplifier starts at block 501, in which an input offset of a chopper amplifier is observed over one or more operation conditions for each of a plurality of selected transistor configurations of a differential transistor bank. The chopper amplifier's input offset can be observed in a variety of ways, including, for example, by observing the difference between the amplifier's non-inverting and inverting inputs, or an amplified version thereof, when the amplifier is connected using negative feedback. In certain implementations, such a voltage difference can be observed with the chopping clocks operating in steady-state conditions. In another embodiment, the chopper amplifier's input offset is observed by observing a magnitude of a component of the chopper amplifier's output signal at the chopping frequency.

In certain implementations, the chopper amplifier's input offset is observed at a plurality of operating conditions, including at least two or more values of the same operating variable. Observing the chopper amplifier's input offset across multiple values of at least one operating variable can be used to determine how the input offset voltage varies across an operating range. For example, an amplifier's input offset can vary or change with temperature, supply voltage, bias current, and common-mode input voltage. By observing the input offset voltage across two or more values of at least one operating variable, a transistor configuration providing a relatively small input offset variation can be selected.

Although the method 500 is illustrated for the case of a chopper amplifier including one differential transistor bank, the chopper amplifier can include multiple differential transistor banks, and the offset of the chopper amplifier can be observed for each selected transistor configuration of the banks. In certain implementations, the chopper amplifier's input offset is observed for different transistor configurations of one of the multiple differential transistor banks while the other differential transistors banks are in a fixed transistor configuration. Once a particular differential transistor bank has been configured, the method can be repeated until all differential transistor banks are configured. In other implementations, input offset is observed when changing the transistor configurations of two or more of the multiple differential transistor banks.

In an ensuing block 502, a particular transistor configuration of the differential transistor bank having reduced or minimal offset over the one or more operating conditions is selected. In certain configurations, the selected transistor configuration can correspond to a transistor configuration having the smallest input offset at a particular operating point. However, in other configurations, the selected transistor configuration can correspond to a transistor configuration associated with a relatively small change or variation of the input offset across a plurality of operating conditions. For example, the selected transistor configuration can correspond to a transistor configuration in which the amplifier's input offset has about the smallest drift across changes in temperature, supply voltage, bias current, and/or common-mode input voltage. In one embodiment, the selected transistor configuration corresponds to a transistor configuration having about the smallest mean square error over the range of operating conditions.

The method 500 continues at a block 503, in which data corresponding to the selected transistor configuration is stored in a programmable memory such that the chopper amplifier operates with the selected transistor configuration.

In certain implementations, the programmable memory is a non-volatile memory integrated on-chip or in a common package with the chopper amplifier, and the non-volatile memory is programmed with the data during factory test.

However, other configurations are possible, such as implementations in which the chopper amplifier is calibrated during power-on and/or during a calibration cycle.

Figure 14:
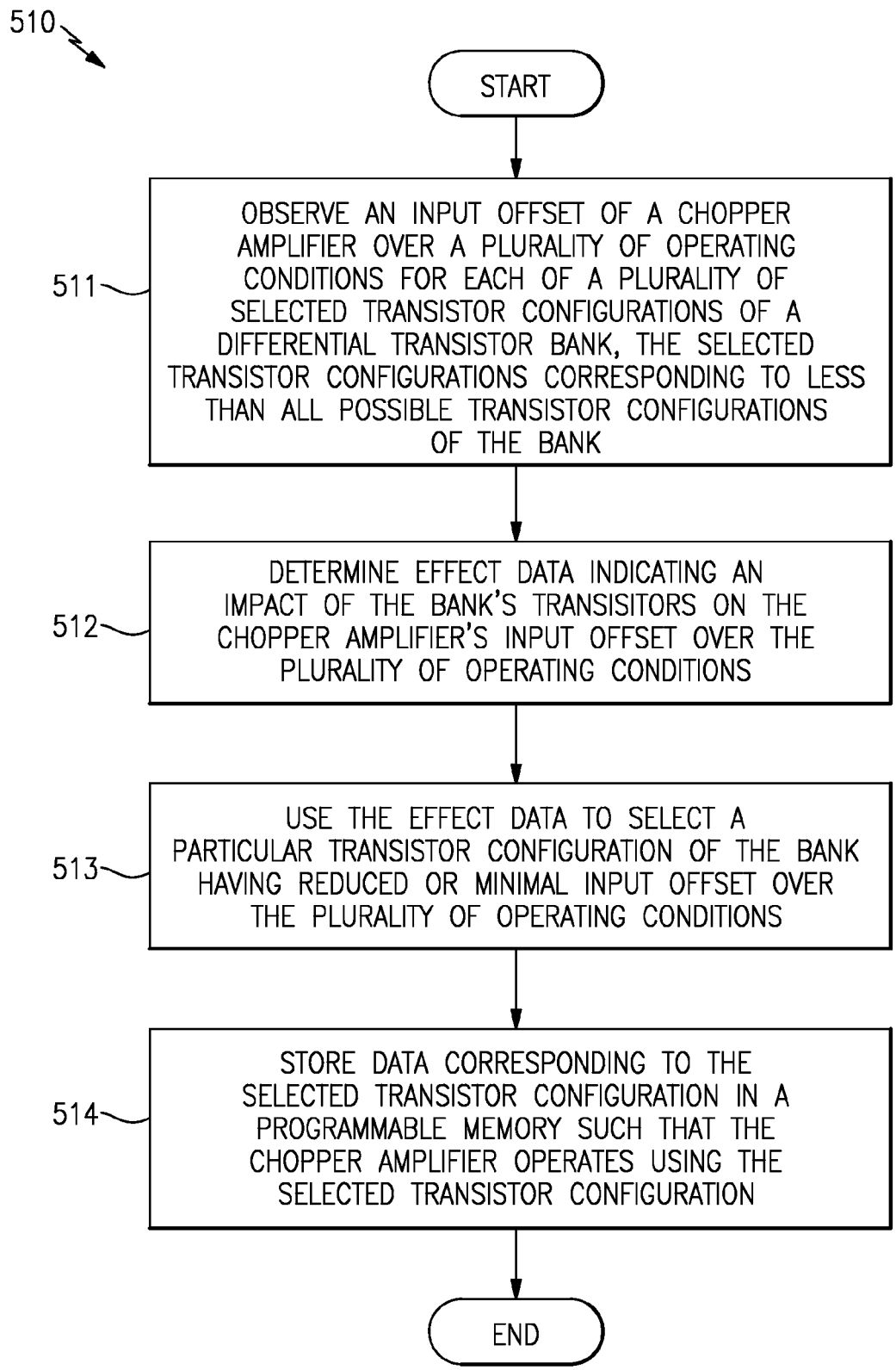
FIG. 14 is a flow diagram of a method of calibrating a chopper amplifier according to another embodiment.

FIG. 14 is a flow diagram of a method 510 of calibrating a chopper amplifier according to another embodiment. The method 510 can be used to calibrate, for example, any of the chopper amplifiers of FIG. 1A, 2-7, 10 or 11.

The illustrated method 510 of calibrating a chopper amplifier starts at block 511, in which an input offset of a chopper amplifier is observed over a plurality of operating conditions for each of a plurality of selected transistor configurations of a differential transistor bank, where the selected transistor configurations correspond to less than all possible transistor configurations of the differential transistor bank.

As was described above, the chopper amplifier's input offset can be observed in a variety of ways, and can be observed across a plurality of operating conditions including at two or more values or a sweep of at least one operating variable.

In the illustrated method 510, the input offset is observed for less than all possible transistor configurations of the differential transistor bank. By observing the input offset for less than all possible transistor configurations, the calibration time of the chopper amplifier can be reduced. In one example, determining input offset for all transistor configurations of a differential transistor bank including 16 transistors can involve 16 choose 8 or 12,870 observations. In one embodiment, input offset is observed for a plurality of linearly independent transistor configurations.

The method 510 continues at a block 512, in which effect data indicating an impact of the bank's transistors on the input offset over the plurality of operating conditions is determined. In certain configurations herein, a contribution of each transistor as a vector can be solved. Additionally, each transistor's contribution can be further decomposed into several effects, which themselves can be vectors. In certain configurations, one or more effects can be selectively minimized or reduced. In one embodiment, the effect data includes a plurality of vectors comprising data representing an impact of the plurality of transistors on the input offset voltage for each of the plurality of operating conditions.

In an ensuing block 513, the effect data is used to select a particular configuration of the differential transistor bank having reduced or minimal offset over the plurality of operating conditions. The selected transistor configuration of the differential transistors bank can correspond to one of the transistor configurations for which the amplifier's input offset was observed or to a transistor configuration for which the amplifier's input offset was not observed. In certain implementations, the selected transistor configuration is selected by computing a linear combination of different combinations of the vectors of the effect data, and determining the linear combination that has the smallest mean square length.

The method 510 can be used to select a transistor configuration that provides low offset across multiple operating points, such as temperature, supply voltage, bias current, and/or common-mode input voltage. The method 510 can involve less calibration time relative to a scheme in which a chopper amplifier's input offset is observed for every transistor configuration of a differential transistor bank.

The method 510 continues at a block 514, in which data corresponding to the selected transistor configuration is stored in a programmable memory such that the chopper amplifier operates with the selected transistor configuration.

Additional details of the method 510 of FIG. 14 can be similar to those described earlier for the method 500 of FIG. 13.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. Examples of the electronic devices can include, but are not limited to, medical imaging and monitoring, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
   a programmable memory configured to generate a first control signal; and a chopper amplifier configured to amplify a differential input voltage signal to generate an output signal, wherein the chopper amplifier comprises:
  a first differential transistor bank comprising a selection circuit and a plurality of transistors, wherein the selection circuit is configured to select a first portion of the plurality of transistors for operation in a first transistor group based on the first control signal, and wherein the selection circuit is further configured to select a second portion of the plurality of transistors for operation in a second transistor group based on the first control signal,
  wherein an input offset voltage of the chopper amplifier varies based on a selection of transistors in the first and second transistor groups.

2. The apparatus of claim 1, wherein absent manufacturing variation at least one of a drive-strength or a geometry of each of the plurality of transistors are substantially the same.

3. The apparatus of claim 1, wherein the selection circuit is configured to select an equal number of transistors in the first and second transistor groups.

4. The apparatus of claim 1, further comprising:
  an input chopping circuit comprising a first input, a second input, a clock input, a first output, and a second output, wherein the input chopping circuit is configured to receive the differential input voltage signal between the first and second inputs and to chop the differential input voltage signal based on a chopping clock signal received at the clock input,
  wherein the differential transistor bank further comprises a first gate input electrically connected to the first output of the input chopping circuit and a second gate input electrically connected to the second output of the input chopping circuit.

5. The apparatus of claim 1, wherein the selection circuit of the first differential transistor bank comprises a plurality of switches, and wherein the plurality of switches is configure to provide one of an input chopping operation or an output chopping operation of the chopper amplifier.

6. The apparatus of claim 1, wherein the first differential transistor bank is positioned along an amplification path of the chopper amplifier, wherein the first differential transistor bank operates as one of differential input transistors of the chopper amplifier, differential load transistors of the chopper amplifier, or differential cascode transistors of the chopper amplifier.

7. The apparatus of claim 1, further comprising a second differential transistor bank, wherein a transistor configuration of the second differential transistor bank is controlled based on a second control signal from the programmable memory.

8. The apparatus of claim 7, further comprising a third differential transistor bank, wherein a transistor configuration of the third differential transistor bank is controlled based on a third control signal from the programmable memory,
  wherein the first differential transistor bank operates as differential input transistors of the chopper amplifier,
  wherein the second differential transistor bank operates as differential load transistors of the chopper amplifier, and
  wherein the third differential transistor bank operates as differential cascode transistors of the chopper amplifier.

9. The apparatus of claim 1, wherein the output signal comprises a single-ended output voltage signal.

10. The apparatus of claim 1, further comprising an integrated circuit (IC), wherein the IC comprises the chopper amplifier and the programmable memory.

11. The apparatus of claim 10, wherein the programmable memory comprises data stored therein, wherein the data is associated with a selected state of the first control signal, wherein the selected state of the first control signal corresponds to a particular transistor configuration of the plurality of transistors in the first and second transistor groups having a smaller input offset as compared to at least a second state of the first control signal.

12. The apparatus of claim 11, wherein the selected state of the first control signal corresponds to a particular transistor configuration of the plurality of transistors in the first and second transistor groups having a minimum input offset as compared to all other states of the first control signal.

13. The apparatus of claim 1, wherein the first differential transistor bank is positioned along an amplification path of the chopper amplifier, wherein the first differential transistor bank comprises a plurality of transistor groups, wherein each of the plurality of transistor groups comprises two or more of an input transistor, a cascode transistor, or a load transistor.

14. A method of calibrating a chopper amplifier, the method comprising:
  observing an input offset voltage of the chopper amplifier for each of a plurality of selected transistor configurations of a first differential transistor bank of the chopper amplifier, wherein the first differential transistor bank comprises a plurality of transistors, and wherein the selected transistor configurations comprise different combinations of the plurality of transistors in a first transistor group and in a second transistor group;
  choosing a transistor configuration based on the observations of the input offset voltage; and
  in a programmable memory, storing data corresponding to the chosen transistor configuration.

15. The method of claim 14, wherein the selected transistor configurations comprise less than all possible transistor configurations of the differential transistor bank.

16. The method of claim 14, further comprising:
  determining effect data for each transistor of the differential transistor bank using the observations of the input offset voltage,
  wherein the chosen transistor configuration is selected based at least partly on the effect data.

17. The method of claim 16, wherein the chosen transistor configuration is not from the plurality of selected transistor configurations.

18. The method of claim 16, further comprising observing the input offset voltage for each of the plurality of selected transistor configurations for each of a plurality of operating conditions, wherein the plurality of operating conditions comprise two or more values of at least one operating variable.

19. The method of claim 18, wherein determining the effect data comprises determining a plurality of vectors comprising data representing an impact of the plurality of transistors on the input offset voltage for each of the plurality of operating conditions.

20. The method of claim 19, wherein choosing the particular combination further comprises determining a linear combination of the vectors having a smallest mean square length.

21. The method of claim 18, wherein the at least one operating variable comprises one or more of temperature, supply voltage, bias current, or common-mode input voltage.

22. The method of claim 14, further comprising:
  retrieving the stored data at turn-on of the IC; and
  applying the stored data such that the chopper amplifier operates with the chosen transistor configuration.

23. The method of claim 14, wherein the first differential transistor bank is positioned along an amplification path of the chopper amplifier, wherein the first differential transistor bank comprises a plurality of transistor groups, wherein each of the plurality of transistor groups comprises two or more of an input transistor, a cascode transistor, or a load transistor.

* * * * *